(12) United States Patent
Tang

(10) Patent No.: US 11,606,872 B2
(45) Date of Patent: Mar. 14, 2023

(54) ELECTRONIC DEVICE HAVING ROTATING MEMBER BEING ROTATABLE ALONG PREDETERMINED TRAJECTORY

(71) Applicant: GUANGDONG OPPO MOBILE TELECOMMUNICATIONS CORP., LTD., Guangdong (CN)

(72) Inventor: Yimei Tang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 413 days.

(21) Appl. No.: 16/800,602

(22) Filed: Feb. 25, 2020

(65) Prior Publication Data

US 2020/0281083 A1 Sep. 3, 2020

(30) Foreign Application Priority Data

Feb. 28, 2019 (CN) .......................... 201910153595.7

(51) Int. Cl.
*H04N 5/225* (2006.01)
*H05K 5/02* (2006.01)
*H05K 5/00* (2006.01)

(52) U.S. Cl.
CPC ......... *H05K 5/0217* (2013.01); *H04N 5/2257* (2013.01); *H05K 5/0017* (2013.01)

(58) Field of Classification Search
CPC .. H05K 5/0217; H05K 5/0017; H04N 5/2257; G06F 1/1686; G06F 1/1613; H04M 1/0264; H04M 2250/20; H04M 1/026
See application file for complete search history.

(56) References Cited

U.S. PATENT DOCUMENTS

| 2015/0002623 | A1* | 1/2015 | Masugi | H04N 5/23241 |
| | | | | 348/37 |
| 2015/0049205 | A1* | 2/2015 | Okabe | H04N 5/2252 |
| | | | | 348/207.1 |
| 2018/0011519 | A1 | 1/2018 | Tang et al. | |
| 2019/0033926 | A1 | 1/2019 | Huang et al. | |

FOREIGN PATENT DOCUMENTS

| CN | 101017321 B | 5/2010 |
| CN | 105208149 A | 12/2015 |
| CN | 106713549 A | 5/2017 |
| CN | 106790826 A | 5/2017 |
| CN | 106817450 A | 6/2017 |

(Continued)

OTHER PUBLICATIONS

European Search Report issued in corresponding EP Application No. 20156655.1 dated Jun. 15, 2020.

(Continued)

*Primary Examiner* — Mekonnen D Dagnew
(74) *Attorney, Agent, or Firm* — Young Basile Hanlon & MacFarlane, P.C.

(57) ABSTRACT

An electronic device is provided. The electronic device includes a device body and a rotating member rotatably coupled with the device body. The device body is provided with a sliding member, where the sliding member is slidable relative to the rotating member and abuts against the rotating member, enabling the rotating member to be rotatable relative to the device body along a predetermined trajectory.

20 Claims, 12 Drawing Sheets

(56) References Cited

FOREIGN PATENT DOCUMENTS

| | | |
|---|---|---|
| CN | 106856516 A | 6/2017 |
| CN | 107071242 A | 8/2017 |
| CN | 206413083 U | 8/2017 |
| CN | 206422833 U | 8/2017 |
| CN | 107380088 A | 11/2017 |
| CN | 207011146 U | 2/2018 |
| CN | 207039674 U | 2/2018 |
| CN | 107995336 A | 5/2018 |
| CN | 108111730 A | 6/2018 |
| CN | 108124052 A | 6/2018 |
| CN | 207526979 U | 6/2018 |
| CN | 207782885 U | 8/2018 |
| CN | 207782888 U | 8/2018 |
| CN | 207782978 U | 8/2018 |
| WO | 2016011620 A1 | 1/2016 |

OTHER PUBLICATIONS

ISR for CN Application No. PCT/CN2020/075388 dated May 26, 2020.
Indian Examination Report for IN Application 202014008346 dated Oct. 29, 2021. (5 pages).

* cited by examiner

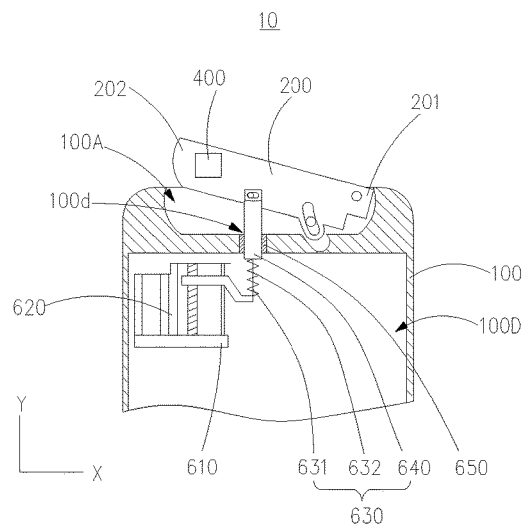
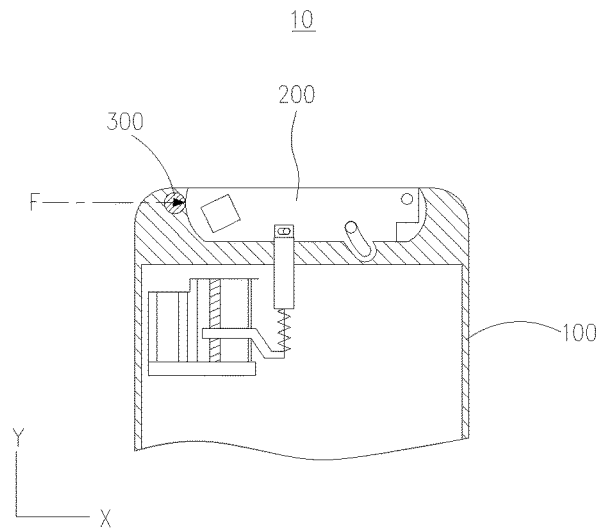
FIG. 24    FIG. 25
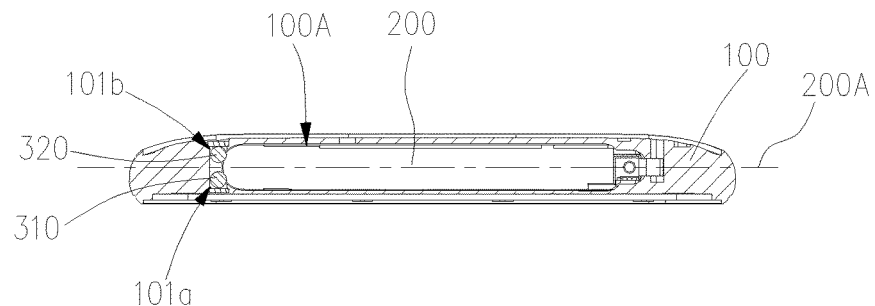
FIG. 26
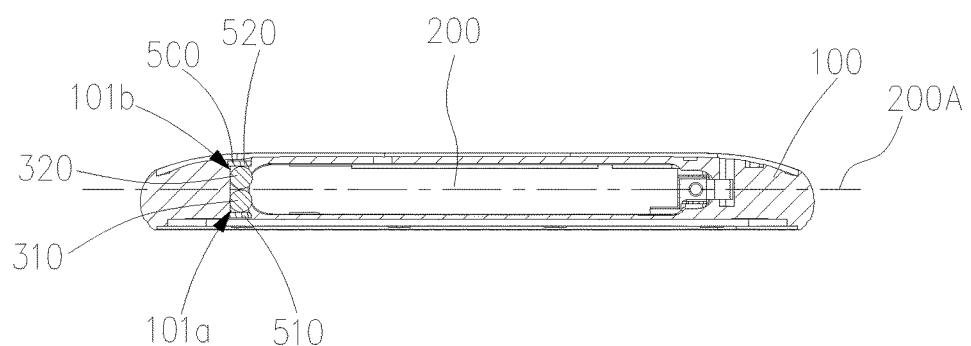
FIG. 27

250 # ELECTRONIC DEVICE HAVING ROTATING MEMBER BEING ROTATABLE ALONG PREDETERMINED TRAJECTORY

CROSS-REFERENCE TO RELATED APPLICATION(S)

This application claims priority to and the benefit of Chinese Patent Application Serial No. 201910153595.7, filed on Feb. 28, 2019, the entire disclosure of which is hereby incorporated by reference.

TECHNICAL FIELD

This disclosure relates to the field of electronic technologies, and in particular, to an electronic device.

BACKGROUND

In order to realize a variety of functions of existing electronic devices, more and more functional components are arranged in an electronic device, and thus how to arrange more and more functional components within a limited space of the electronic device is a current challenge. In the related art, some functional components are mounted in a rotating base, and the rotating base can rotate relative to a casing of the electronic device. However, a relatively large friction force between the rotating base and the casing is prone to cause the rotating base to fail to move smoothly.

SUMMARY

An electronic device is provided according to implementations of the present disclosure. The electronic device includes a device body and a rotating member rotatably coupled with the device body. The device body is provided with a sliding member. The sliding member is slidable relative to the rotating member and abuts against the rotating member, enabling the rotating member to be rotatable relative to the device body along a predetermined trajectory.

An electronic device is further provided according to the present disclosure. The electronic device includes a rotating member and a device body. An end of the rotating member is rotatably coupled with the device body. The device body is provided with a sliding member, and the sliding member is rotatable relative to the rotating member and used for applying an abutting force against the rotating member, enabling another end of the rotating member to be rotatable relative to the device body along a predetermined trajectory.

BRIEF DESCRIPTION OF DRAWINGS

To describe technical solutions of the present disclosure more clearly, the following briefly introduces the accompanying drawings required for describing the implementations. Apparently, the accompanying drawings in the following description only illustrate some implementations of the present disclosure. Those of ordinary skill in the art may also obtain other drawings based on these accompanying drawings without creative efforts.

FIG. 24 is a schematic structural view of an example electronic device according to an implementation of the present disclosure.

FIG. 25 is a schematic structural view of an example electronic device according to an implementation of the present disclosure.

FIG. 26 is a schematic structural view of an example electronic device according to an implementation of the present disclosure.

FIG. 27 is a schematic structural view of an example electronic device according to an implementation of the present disclosure.

DETAILED DESCRIPTION

Figure 1:
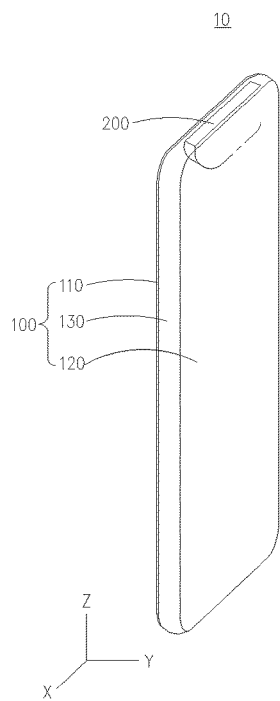
FIG. 1 is a schematic structural view of an electronic device according to an implementation of the present disclosure, illustrating a rotating member of the electronic device being received in the electronic device.
Figure 2:
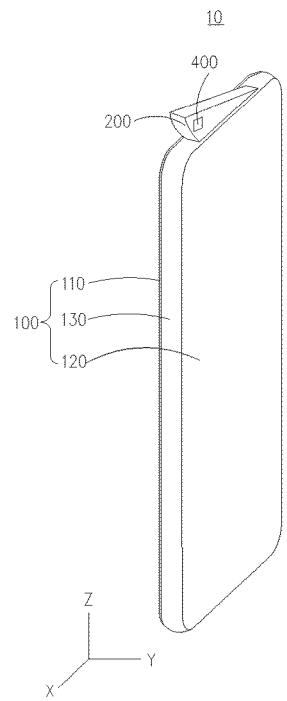
FIG. 2 is a schematic structural view of the electronic device according to an implementation of the present disclosure, illustrating the rotating member of the electronic device extending out of the electronic device.
Figure 3:
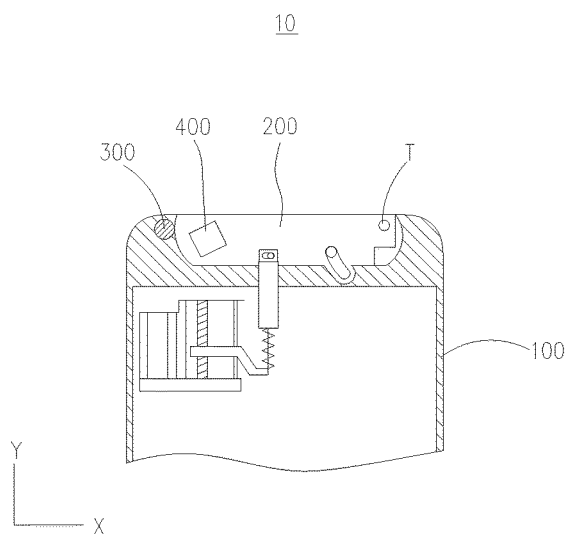
FIG. 3 is a schematic structural view of an example electronic device according to an implementation of the present disclosure.
Figure 4:
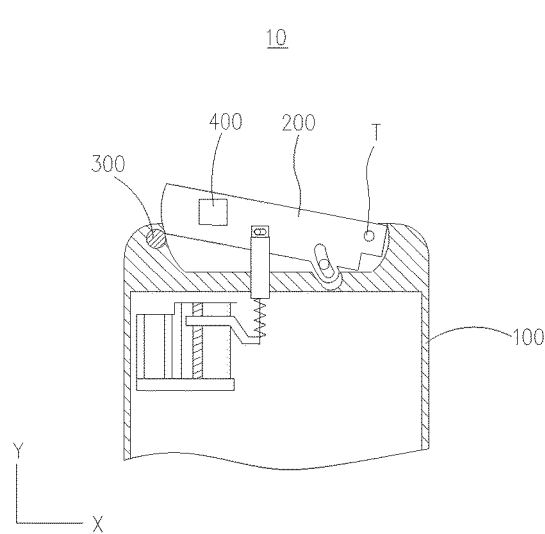
FIG. 4 is a schematic structural view of an example electronic device according to an implementation of the present disclosure.

The technical solutions in the implementations of the present disclosure are clearly and completely described in the following with reference to the accompanying drawings in the implementations of the present disclosure. Apparently, the described implementations are merely a part of rather than all the implementations of the present disclosure. All other implementations obtained by those of ordinary skill in the art based on the implementations of the present disclosure without creative efforts are within the scope of the present disclosure.

As illustrated in FIGS. 1-4, an electronic device 10 includes a device body 100 and a rotating member 200 rotatably coupled with the device body 100. The device body 100 is provided with a sliding member 300. The sliding member 300 is slidable relative to the rotating member 200 and abuts against the rotating member 200, enabling the rotating member 200 to be rotatable relative to the device body 100 along a predetermined trajectory.

In an implementation, the predetermined trajectory is a segment of a circle, and a curvature center of the predetermined trajectory is positioned at a side of the sliding member 300 close to the rotating member 200.

The electronic device 10 may be any device with communication and storage functions. For example, the electronic device 10 is a network-enabled smart device such as a tablet, a mobile phone, an e-reader, a remote control, a personal computer (PC), a laptop, an in-vehicle device, a network television, a wearable device, and so on.

The device body 100 includes components of the electronic device 10 other than the rotating member 200. The device body 100 includes a cell cover 110, a display screen 120, and a middle frame 130. In an implementation, the cell cover 110 is fixed to the middle frame 130 and the display screen 120 is fixed to the middle frame 130. In another implementation, the middle frame 130 is received in the cell cover 110 and the display screen 120 is fixed to the cell cover 110.

A functional component 400 is mounted on the rotating member 200. The functional component 400 may be a camera module, a flash module, a proximity light sensor module, or a structured light sensor module. When the rotating member 200 rotates relative to the device body 100 to extend out of the device body 100, the functional component 400 locates outside the device body 100, such that functions of the functional component 400 can be implemented outside the device body 100, facilitating realizing various structural transformation modes of the electronic device 10, and broadening an application range of the electronic device 10. In such a case that the functional component 400 is a camera module, the camera module is mounted on the rotating member 200, and the camera module tilts relative to the rotating member 200 (for example, a top surface of the camera module tilts relative to a top surface of the rotating member 200). When the rotating member 200 completely extends out of a receiving groove 100A or the rotating member 200 extends out of a receiving groove 100A to the maximum degree, an image captured by the camera module is taken with a normal perspective. In an implementation, the image captured by the camera module being taken with the normal perspective means that the image captured by the camera module conforms to people's daily photographing habits, that is, the perspective of the image captured is adapted to the device body 100.

In an implementation, the sliding member 300 may be a ball, a roller, or other sliding structures. The sliding member 300 is disposed in the device body 100 and slidable relative to the rotating member 200. The sliding member 300 abuts against the rotating member 200 to assist the rotating member 200 in rotating relative to the device body 100 along the predetermined trajectory.

In an implementation, the rotating member 200 is in point contact with the sliding member 300, such that a friction force acting on the rotating member 200 can be minimized.

In some implementations, the sliding member 300 may be coupled with the device body 100 via a fixing member. The fixing member may be a rotating shaft T. The sliding member 300 may be stationary relative to the device body 100. Alternatively, the sliding member 300 may be movable relative to the device body 100. The sliding member 300 is movable relative to the rotating member 200. In other implementations, the device body 100 defines a hole thereon and the sliding member 300 is received in the hole, such that the sliding member 300 is fixed without any additional fixing member, enabling the sliding member 300 to be installed in a narrow space of the device body 100 and facilitating making the electronic device 10 be light and thin. The sliding member 300 abutting against the rotating member 200 can make a certain gap be defined between the rotating member 200 and the device body 100, such that the rotating member 200 is free from direct contact with the device body 100, facilitating reducing a friction force exerted on the rotating member 200, and achieving a smooth movement of the rotating member 200 relative to the device body 100. In an implementation, in such a case that the sliding member 300 is a ball, the ball is in point contact with the rotating member 200. Compared with the surface contact, the point contact results in a less friction force due to that a contact area is smaller, thereby achieving a smooth movement of the rotating member relative to the device body and preventing the rotating member 200 from being stuck. In an implementation, since the rotating member 200 is not in direct contact with the device body 100, the device body 100 can be prevented from being scratched due to the movement of the rotating member 200, thereby avoiding damage of an anode layer of the device body 100.

In some implementations, the rotating member 200 is rotatably coupled to the device body 100 via the rotating shaft T. The rotating shaft T is fixed to the rotating member 200, the device body 100 defines a first fixing hole, and the rotating shaft T is received in the first fixing hole. Alternatively, the rotating shaft T is fixed to the device body 100, the rotating member 200 defines a second fixing hole, and the rotating shaft T is received in the second fixing hole.

Figure 5:
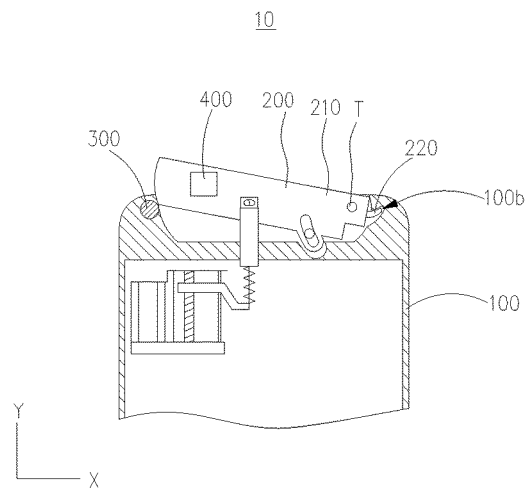
FIG. 5 is a schematic structural view of an example electronic device according to an implementation of the present disclosure.

Referring to FIG. 5, in some implementations, the rotating member 200 includes a rotating body 210 and an engaging portion 220. The device body 100 defines an engaging groove 100b. The engaging portion 220 is received in the engaging groove 100b and rotatable in the engaging groove 100b. The rotating body 210 rotates relative to the device body 100 via the engaging portion 220. The engaging portion 220 is in a hook shape and can hook an inner wall of the engaging groove 100b, thereby preventing the rotating body 210 from falling off from the device body 100. Compared with using the rotating shaft T, in this implementation, after rotation the rotating body 210 is in close contact with an outer wall of the engaging groove 100b of the device body 100 by controlling a movement trajectory of the engaging portion 220, thereby avoiding that a discontinuous exterior surface of the electronic device 10 appears after the rotating member 200 rotates relative to the device body 100. In other words, this implementation can solve a problem of the discontinuous exterior surface of the electronic device 10, thereby improving the unity of appearance of the electronic device 10.

The electronic device 10 according to the implementations of the present disclosure includes the device body 100 and the rotating member 200 rotatably coupled with the device body 100. The device body 100 is provided with the sliding member 300, and the sliding member 300 is slidable relative to the rotating member 200. When the rotating member 200 rotates relative to the device body 100, the sliding member 300 abuts against the rotating member 200, enabling the rotating member 200 to be rotatable relative to the device body 100 along the predetermined trajectory. The sliding member 300 abutting against the rotating member 200 can make a gap be defined between the rotating member 200 and the device body 100, such that the rotating member 200 is free from direct contact with the device body 100, preventing the device body 100 from being scratched due to the movement of the rotating member 200, reducing the friction force when the rotating member 200 moves relative to the device body 100, avoiding that the rotating member 200 is stuck, and achieving a smooth movement of the rotating member 200 relative to the device body 100. Moreover, since the sliding member 300 slides along and abuts against the rotating member 200, an unnecessary shaking of the rotating member 200 can be avoided under the premise of achieving a normal sliding movement of the rotating member 200, such that a structural arrangement of the electronic device 10 is compact.

Figure 6:
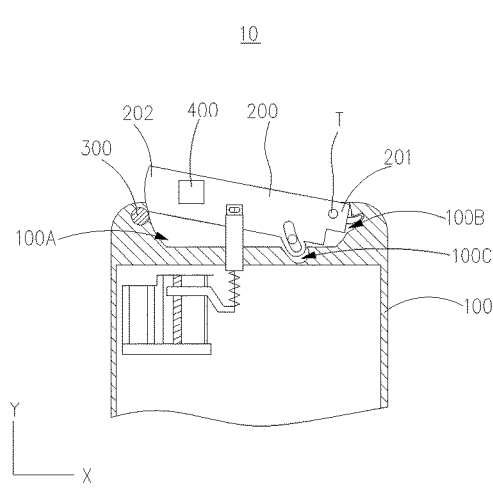
FIG. 6 is a schematic structural view of an example electronic device according to an implementation of the present disclosure.

Referring to FIG. 6, in an implementation, the device body 100 defines a receiving groove 100A. The rotating member 200 is at least partially received in the receiving groove 100A. The rotating member 200 includes a first end 201 and a second end 202 opposite the first end 201. The first end 201 is rotatably coupled with the device body 100. When the first end 201 rotates relative to the device body 100, the second end 202 is enabled to be extend out of or received in the receiving groove 100A.

In an implementation, the rotating member 200 can be switched between a first state and a second state. In the first state, the rotating member 200 is fully received in the receiving groove 100A, and in the second state, the rotating member 200 is partially received in the receiving groove 100A. When the rotating member 200 is in the first state, the orthographic projection of the rotating member 200 on the device body 100 falls within the outline of the device body 100. When the rotating member 200 is in the second state, the orthographic projection of the rotating member 200 on the device body 100 partially falls within the outline of the device body 100.

It is noted that, when the rotating member 200 is in the first state, the second end 202 of the rotating member 200 is positioned at a terminal point of the predetermined trajectory, and when the rotating member 200 is in the second state, the second end 202 of the rotating member 200 is positioned at another terminal point of the predetermined trajectory. When the rotating member 200 is switched from the first state to the second state, the rotating member 200 rotates along the predetermined trajectory.

An avoidance space 100B is defined at a side of the first end 201 adjacent to the device body 100. The avoidance space 100B is defined in an appearance surface of the device body 100 facing an interior of the device body 100. The avoidance space 100B is used to avoid components arranged in the device body 100. Since the avoidance space 100B is defined in the device body 100, a machining start position of a cutting tool is not on the appearance surface of the device body 100 when processing the avoidance space 100B, and thus no sharp corner is left on the appearance surface of the device body 100. In this way, the structural strength of the device body 100 can be strengthened on the one hand, and the unity of appearance of the electronic device 10 can be improved on the other hand.

An avoidance groove 100C is defined at a side of the device body 100 adjacent to the rotating member 200 (that is, a bottom of the receiving groove 100A defines the avoidance groove 100C), and the avoidance groove 100C is used for avoiding a part of the rotating member 200, thereby avoiding an interference with the rotating member 200 as the rotating member 200 rotates. By defining the avoidance groove 100C at the side of the device body 100 adjacent to the rotating member 200, a part of the rotating member 200 can be accommodated in the avoidance groove 100C. That is, the shape of the avoidance groove 100C is the same as that of the part of the rotating member 200, thereby reducing a space of the electronic device 10 for arranging the components, and enabling the components of the electronic device 10 to be arranged compactly. In addition, the rotating member 200 can be pushed out of the receiving groove 100A of the device body 100 with a small push stroke, facilitating power saving.

Figure 7:
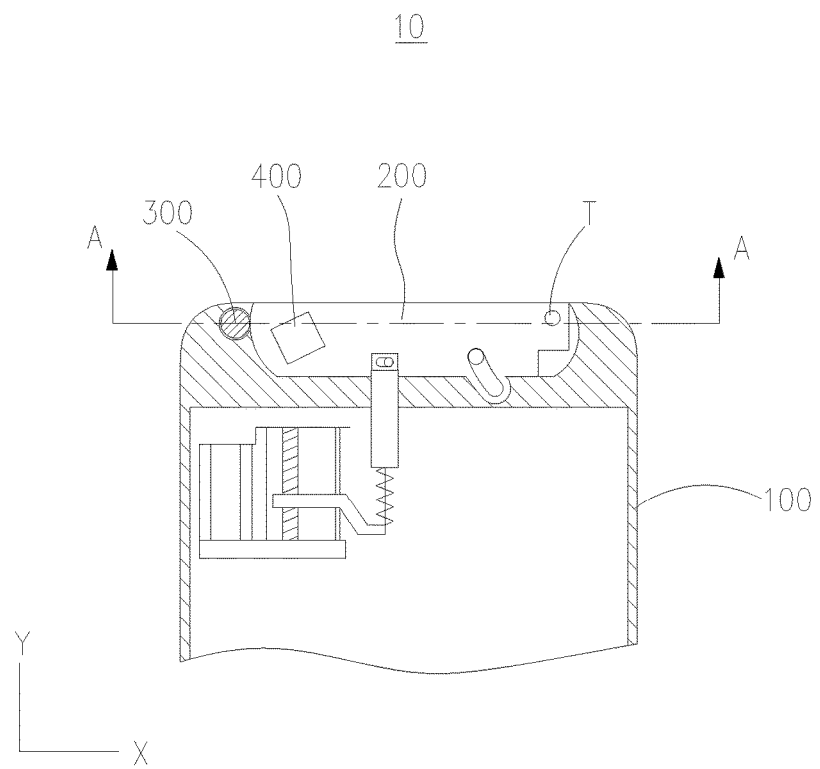
FIG. 7 is a schematic structural view of an example electronic device according to an implementation of the present disclosure.
Figure 8:
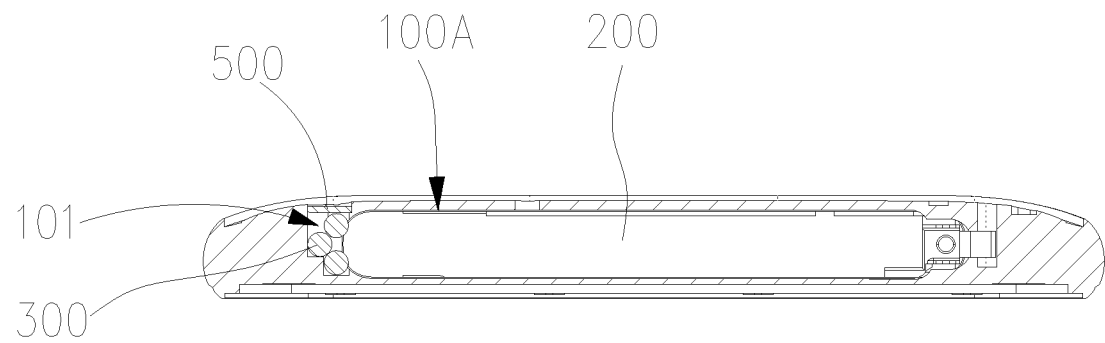
FIG. 8 is a schematic structural view of an example electronic device according to an implementation of the present disclosure.

As illustrated in FIG. 7 and FIG. 8, the device body 100 defines a mounting hole 101. The sliding member 300 is received in the mounting hole 101. The electronic device 10 further includes a limiting member 500 disposed at an opening of the mounting hole 101. The limiting member 500 is used for limiting a movement of the sliding member 300.

In an implementation, the mounting hole 101 is in communication with the receiving groove 100A, and the sliding member 300 is positioned at a space in communication with the mounting hole 101 and the receiving groove 100A. The limiting member 500 is disposed at the opening of the mounting hole 101. The limiting member 500 abuts against the sliding member 300 to prevent the sliding member 300 from being detached from the mounting hole 101. In an implementation, the limiting member 500 is a metal tablet.

Figure 9:
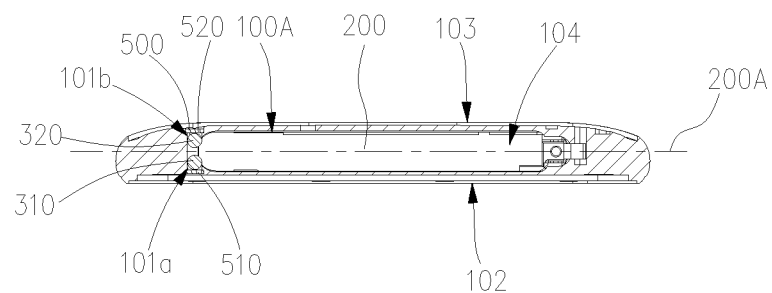
FIG. 9 is a schematic structural view of an example electronic device according to an implementation of the present disclosure.

As illustrated in FIG. 9, in an implementation, the device body 100 includes a front surface 102, a rear surface 103 opposite the front surface 102, and a side surface 104 connected between the front surface 102 and the rear surface 103. The mounting hole 101 includes a first mounting hole 101a and a second mounting hole 101b. In an implementation, the first mounting hole 101a is defined in the front surface 102, the second mounting hole 101b is defined in the rear surface 103, and the receiving groove 100A is defined in the side surface 104. In another implementation, the first mounting hole 101a is defined facing and close to the front surface 102, the second mounting hole 101b is defined facing and close to the rear surface 103, and the receiving groove 100A is defined in the side surface 104. The electronic device 10 further includes a first sliding member 310 disposed at the first mounting hole 101a and a second sliding member 320 disposed at the second mounting hole 101b. When the rotating member 200 rotates relative to the device body 100, the first sliding member 310 and the second sliding member 320 respectively abut against the rotating member 200. The limiting member 500 includes a first limiting member 510 and a second limiting member 520. The first limiting member 510 is fixed at an opening of the first mounting hole 101a and abuts against the first sliding member 310. The second limiting member 520 is fixed at an opening of the second mounting hole 101b and abuts against the second sliding member 320. Since the mounting hole 101 includes the first mounting hole 101a and the second mounting hole 101b, the first sliding member 310 and the second sliding member 320 may be installed in the first mounting hole 101a and the second mounting hole 101b respectively, thereby facilitating the installation and removal of the first sliding member 310 and the second sliding member 320.

In this implementation, the sliding member 300 includes the first sliding member 310 and the second sliding member 320. The first sliding member 310 and the second sliding member 320 both abut against the rotating member 200, keeping the gap between the rotating member 200 and the device body 100, and preventing the device body 100 from being scratched due to the movement of the rotating member 200. The first sliding member 310 and the second sliding member 320 are symmetrically arranged along a symmetry plane 200A of the rotating member 200. The sliding member 300 abutting against the rotating member 200 can make the rotating member 200 be free from direct contact with the device body 100, thereby reducing a contact area, reducing the friction force, and achieving a smooth movement of the rotating member 200 relative to the device body 100. In such a case that the first sliding member 310 and the second sliding member 320 are both balls, the first sliding member 310 and the second sliding member 320 are in point contact with the rotating member 200, the friction force during the rotation of the rotating member 200 can be minimized, thereby avoiding a situation that the rotating member 200 is stuck.

In an implementation, a method for processing the device body 100 includes but is not limited to the following operations.

(a1) A blank is provided. The blank includes a first surface, a second surface opposite the first surface, and a side surface 104 connected between the first surface and the second surface.

(b1) The side surface 104 of the blank is processed to form the receiving groove 100A.

(c1) The first surface of the blank is processed to form the mounting hole 101.

In another implementation, a method for processing the device body 100 includes but is not limited to the following operations.

(a2) A blank is provided. The blank includes a first surface, a second surface opposite the first surface, and a side surface 104 connected between the first surface and the second surface.

(b2) The side surface 104 of the blank is processed to form the receiving groove 100A.

(c2) The first surface and the second surface of the blank are processed to form the first mounting hole 101a and the second mounting hole 101b, respectively.

In an implementation, the first surface is processed to form the front surface 102, and the second surface is processed to form the rear surface 103.

Figure 10:
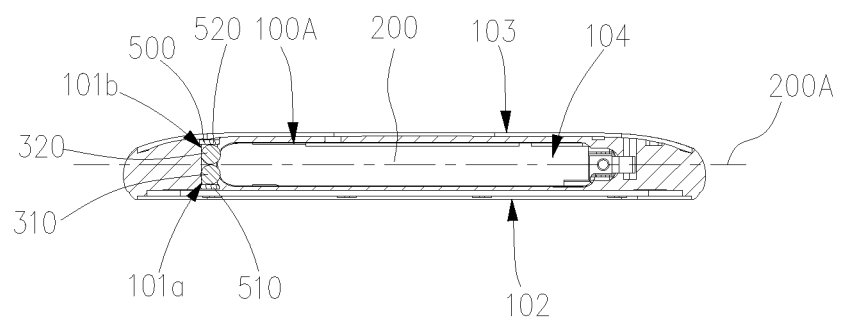
FIG. 10 is a schematic structural view of an example electronic device according to an implementation of the present disclosure.

Referring to FIG. 10, in an implementation, the first mounting hole 101a is in communication with the second mounting hole 101b, and the first sliding member 310 abuts against the second sliding member 320.

In an implementation, the mounting hole 101 includes the first mounting hole 101a and the second mounting hole 101b in communication with the first mounting hole 101a. The first sliding member 310 and the second sliding member 320 are both positioned in the mounting hole 101, and the first sliding member 310 is in direct contact with the second sliding member 320. That is, the first sliding member 310 is operable to slide relative to the second sliding member 320, and the first sliding member 310 and the second sliding member 320 both abut against the rotating member 200. The first sliding member 310 directly abuts against and is operable to slide relative to the second sliding member 320, thereby enabling a smooth movement of the first sliding member 310 relative to the second sliding member 320. Furthermore, since the mechanical property of the first sliding member 310 is the same as that of the second sliding member 320, and the first sliding member 310 abuts against the second sliding member 320, abutting forces between the first sliding member 310 and the second sliding member 320 are enabled to be distributed uniformly. Moreover, the first sliding member 310 and the second sliding member 320 are symmetrically arranged along the symmetry plane 200A of the rotating member 200, thereby avoiding a situation that a displacement of the rotating member 200 is generated and the rotating member 200 is further stuck due to uneven forces between the first sliding member 310 and the second sliding member 320. The first sliding member 310 and the second sliding member 320 cooperatively abut against the rotating member 200, and thus when an abutting force exerted against the rotating member 200 by the first sliding member 310 and an abutting force exerted against the rotating member 200 by the second sliding member 320 have the same component in the thickness direction of the rotating member 200, forces acting on the rotating member 200 can be balanced. That is, the rotating member 200 can be positioned in the middle of the receiving groove 100A, facilitating keeping the gap between the rotating member 200 and the device body 100, and avoiding that the rotating member 200 is stuck.

Figure 11:
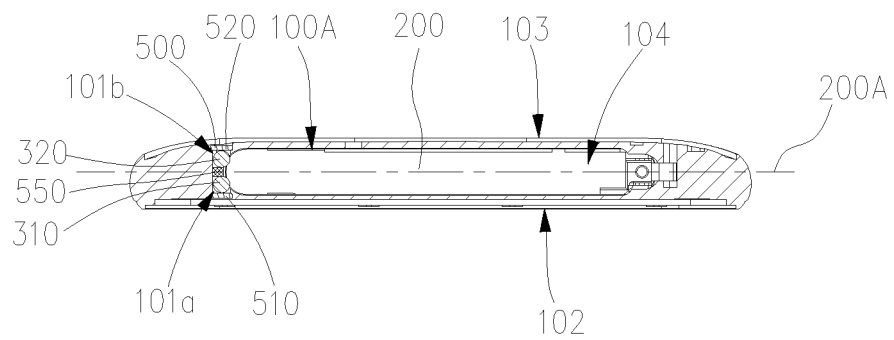
FIG. 11 is a schematic structural view of an example electronic device according to an implementation of the present disclosure.

Referring to FIG. 11, in another implementation, a spacer 550 is disposed between the first mounting hole 101a and the second mounting hole 101b. By means of the spacer 550, the first sliding member 310 is disposed in the first mounting hole 101a, and the second sliding member 320 is disposed in the second mounting hole 101b.

The spacer 550 is spaced apart from the rotating member 200. That is, the spacer 550 is free from interfering with the movement of the rotating member 200, such that a smooth movement of the rotating member 200 relative to the device body 100 can be achieved. The spacer 550 is disposed between the first mounting hole 101a and the second mounting hole 101b, and the first sliding member 310 is disposed in the first mounting hole 101a and the second sliding member 320 is disposed in the second mounting hole 101b, such that a mutual interference between the first sliding member 310 and the second sliding member 320 generated due to inconsistent movement directions can be avoided. In such a case that the first sliding member 310 and the second sliding member 320 move asynchronously, the mutual interference between the first sliding member 310 and the second sliding member 320 is inevitable, resulting in uneven forces generated between the first sliding member 310 and the second sliding member 320. When such uneven forces are transmitted to the rotating member 200, the displacement of the rotating member 200 is generated, and thus the gap between the rotating member 200 and the device body 100 may disappear. At this point, the rotating member 200 is in a risk of being stuck, and application functions of the electronic device 10 fail to be achieved normally.

In an implementation, the spacer 550 may be additionally provided, neither a part of the rotating member 200 itself nor a part of the device body 100 itself. The spacer 550 is fixedly mounted on the device body 100 or the rotating member 200 to form a separation between the first sliding member 310 and the second sliding member 320.

In another implementation, the spacer 550 is a part of the device body 100. When processing the device body 100, the spacer 550 is formed integrally with the device body 100, such that it is unnecessary to provide a structure for fixing the spacer 550, thereby facilitating making the electronic device 10 be light and thin.

In another implementation, the spacer 550 is a part of the rotating member 200. When processing the rotating member 200, the spacer 550 is formed integrally with the rotating member 200, such that it is unnecessary to provide a structure for fixing the spacer 550, thereby facilitating making the electronic device 10 be light and thin.

Figure 12:
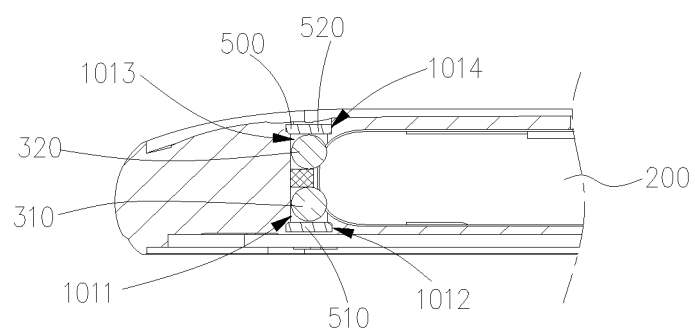
FIG. 12 is a schematic structural view of an example electronic device according to an implementation of the present disclosure.

Referring to FIG. 12, the first mounting hole 101a includes a first hole 1011 and a second hole 1012 in communication with and opposite the first hole 1011. The first hole 1011 is further adjacent to the second mounting hole 101b than the second hole 1012. The first hole 1011 has a smaller radial dimension than the second hole 1012. The first sliding member 310 is received in the first hole 1011. The first limiting member 510 is disposed in the second hole 1012.

The second mounting hole 101b includes a third hole 1013 and a fourth hole 1014 in communication with and opposite the third hole 1013. The third hole 1013 is further adjacent to the first mounting hole 101a than the fourth hole 1014. The third hole 1013 has a smaller radial dimension than the fourth hole 1014. The second sliding member 320 is received in the third hole 1013, and the second limiting member 520 is disposed in the fourth hole 1014. When the radial dimension of the first hole 1011 is smaller than that of the second hole 1012, on the one hand, it facilitates installing the first sliding member 310 in the first hole 1011, and on the another hand, it facilitates fixing the first limiting member 510 to a bottom wall of the second hole 1012 and the removal of the first limiting member 510. Similarly, when the radial dimension of the third hole 1013 is smaller than that of the fourth hole 1014, on the one hand, it facilitates installing the second sliding member 320 in the third hole 1013, and on the another hand, it facilitates fixing the second limiting member 520 to a bottom wall of the fourth hole 1014 and the removal of the second limiting member 520.

Figure 13:
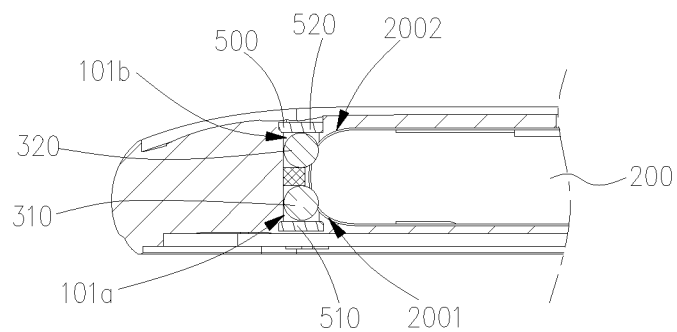
FIG. 13 is a schematic structural view of an example electronic device according to an implementation of the present disclosure.

Referring to FIG. 13, in yet another implementation, the rotating member 200 has a curved-shaped portion adjacent to the first mounting hole 101a and the second mounting hole 101b. The portion includes a first curved portion 2001 and a second curved portion 2002 coupled with the first curved portion 2001. The first sliding member 310 is in close contact with the first curved portion 2001, and the second sliding member 320 is in close contact with the second curved portion 2002.

In an implementation, when the portion of the rotating member 200 abutting against the first sliding member 310 and the second sliding member 320 is in a curved shape, the stress distribution at the portion is divergent, thereby enabling forces acting on the portion of the rotating member 200 to be uniform, and avoiding stress concentration. When the first sliding member 310 is in close contact with the first curved portion 2001 and slides relative to the first curved portion 2001, and the second sliding member 320 is in close contact with the second curved portion 2002 and slides relative to the second curved portion 2002, a smooth movement of the first sliding member 310 and the second sliding member 320 is achieved. Therefore, on the one hand, a relatively stable rotation of the rotating member 200 relative to the device body 100 can be achieved, and on the other hand, since the movement of the first sliding member 310 and the second sliding member 320 relative to the rotating member 200 is relatively smooth, and abutting forces exerted on the rotating member 200 by the first sliding member 310 and the second sliding member 320 are also distributed relatively evenly, an unnecessary offset of the rotating member 200 can be avoided, facilitating a relatively smooth movement of the rotating member 200 relative to the device body 100.

In an implementation, a curvature center of the first curved portion 2001 is positioned at a side facing away from the first mounting hole 101a, and a curvature center of the second curved portion 2002 is positioned at a side facing away from the second mounting hole 101b. A curvature radius of the first curved portion 2001 is consistent with a curvature radius of the second curved portion 2002, that is, the curvature radius of the first curved portion 2001 is substantially equal to the curvature radius of the second curved portion 2002.

In an implementation, the first curved portion 2001 is in a convex shape, and the second curved portion 2002 is in a convex shape. When the curvature radius of the first curved portion 2001 equals the curvature radius of the second curved portion 2002 and the first sliding member 310 has the same volume as the second sliding member 320, an abutting force exerted against the first curved portion 2001 by the first sliding member 310 is in consistence with an abutting force exerted against the second curved portion 2002 by the second sliding member 320, that is, the abutting force exerted against the first curved portion 2001 by the first sliding member 310 and the abutting force exerted against the second curved portion 2002 by the second sliding member 320 are substantially equal in magnitude. At this point, the abutting forces exerted against the rotating member 200 by the first sliding member 310 and the second sliding member 320 are distributed evenly, such that the rotating member 200 can be kept in a centered position relative to the device body 100, the gap between the rotating member 200 and the device body 100 can be easily achieved, and a smooth rotation of the rotating member 200 relative to the device body 100 can be achieved.

Figure 14:
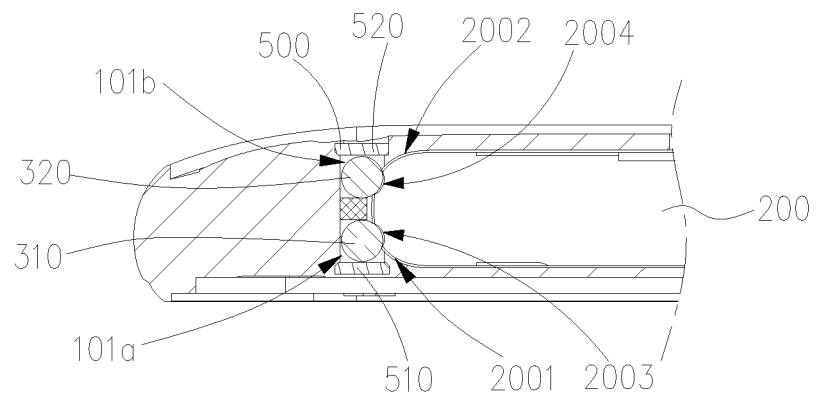
FIG. 14 is a schematic structural view of an example electronic device according to an implementation of the present disclosure.

Referring to FIG. 14, the first curved portion 2001 defines a first sliding groove 2003, and the second curved portion 2002 defines a second sliding groove 2004. When the rotating member 200 rotates relative to the device body 100, the first sliding member 310 slides in the first sliding groove 2003, and the second sliding member 320 slides in the second sliding groove 2004.

In this implementation, the first sliding groove 2003 is used for limiting the movement of the first sliding member 310, and the second sliding groove 2004 is used for limiting the movement of the second sliding member 320. The first sliding groove 2003 and the second sliding groove 2004 are arranged in parallel and spaced apart from each other, such that the abutting forces exerted against the rotating member 200 by the first sliding member 310 and the second sliding member 320 each are kept in a constant direction. That is, during the rotation of the rotating member 200 relative to the device body 100, the abutting forces exerted against rotating member 200 by the first sliding member 310 and the second sliding member 320 are always attributed evenly, thereby avoiding uneven distribution of forces applied on the rotating member 200 during the rotation of the rotating member 200 relative to the device body 100, keeping the gap between the rotating member 200 and the device body 100, avoiding that the rotating member 200 is stuck, and enabling a smooth rotation of the rotating member 200 relative to the device body 100.

In an implementation, the first sliding member 310 slides along the first sliding groove 2003, and the second sliding member 320 slides along the second sliding groove 2004. At this point, the first sliding member 310 is in surface contact with the first sliding groove 2003, and the second sliding member 320 is also in surface contact with the second sliding groove 2004. In this implementation, the first sliding member 310 and the second sliding member 320 are enabled to be in surface contact with the rotating member 200, to increase a contact area between the first sliding member 310 and the first sliding groove 2003 and a contact area between the second sliding member 320 and the second sliding groove 2004, such that stably limiting the movement of the first sliding member 310 can be achieved via the first sliding groove 2003, and stably limiting the movement of the second sliding member 320 can be achieved via the second sliding groove 2004, the rotating member 200 can be prevented from shaking during the rotation of the rotating member 200 relative to the device body 100, and a relatively stable rotation of the rotating member 200 relative to the device body 100 can be achieved.

In yet another implementation, the sliding member 300 is a ball. The first sliding member 310 and the second sliding member 320 are the same in volume. The first mounting hole 101a is opposite to the second mounting hole 101b. The first mounting hole 101a and the second mounting hole 101b are the same in radial dimension.

In this implementation, the first sliding member 310 is completely identical to the second sliding member 320. The first mounting hole 101a is opposite to the second mounting hole 101b, and the first mounting hole 101a and the second mounting hole 101b are also completely identical in radial dimension. When the first sliding member 310 abuts against the rotating member 200 and the second sliding member 320 abuts against the rotating member 200, the first sliding member 310 and the second sliding member 320 are symmetrically arranged along the symmetry plane 200A of the rotating member 200, and a balance between a first abutting force exerted against the rotating member 200 by the first sliding member 310 and a second abutting force exerted against the rotating member 200 by the second sliding member 320 can be achieved, thereby keeping the gap between the rotating member 200 and the device body 100, and thus, on the one hand, the friction force between the rotating member 200 and the device body 100 is reduced, such that a smooth movement of the rotating member 200 relative to the device body 100 is achieved, and on the other hand, the device body 100 can be prevented from being scratched due to the movement of the rotating member 200.

Figure 15:
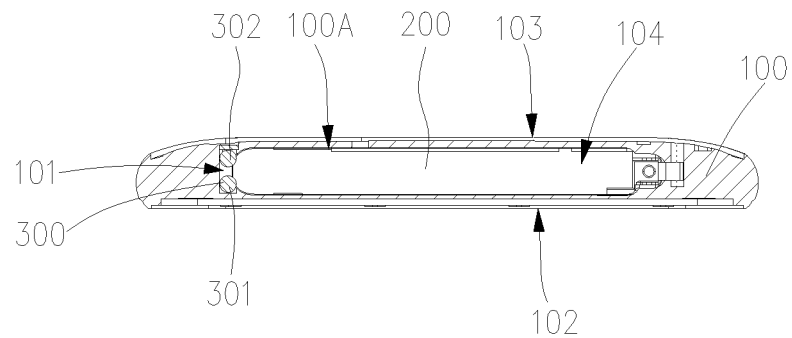
FIG. 15 is a schematic structural view of an example electronic device according to an implementation of the present disclosure.

Referring to FIG. 15, the sliding member 300 includes a first sliding sub-member 301 and a second sliding sub-member 302. The device body 100 defines a mounting hole 101. The first sliding sub-member 301 and the second sliding sub-member 302 are received in the mounting hole 101.

In an implementation, the mounting hole 101 is defined on the front surface 102 or the rear surface 103 of the device body 100. The receiving groove 100A is defined on the side surface 104 of the device body 100, and the first sliding sub-member 301 and the second sliding sub-member 302 are stacked in a direction in which the mounting hole 101 extends. When the rotating member 200 is received in the receiving groove 100A of the device body 100, an opening of the mounting hole 101 abuts against an inner wall of the device body 100 (for example, the opening of the mounting hole 101 is covered and sealed by the inner wall of the device body 100), such that water and dust can be prevented from entering the mounting hole 101.

In an implementation, the first sliding sub-member 301 is in direct contact with the second sliding sub-member 302, and at least one of the first sliding sub-member 301 or the second sliding sub-member 302 abuts against the rotating member 200.

In this implementation, the first sliding sub-member 301 is in direct contact with the second sliding sub-member 302. That is, the first sliding sub-member 301 is operable to slide relative to the second sliding sub-member 302, and at least one of the first sliding sub-member 301 or the second sliding sub-member 302 abuts against the rotating member 200. The first sliding sub-member 301 directly abuts against and is operable to slide relative to the second sliding sub-member 302, thereby enabling a smooth movement of the first sliding sub-member 301 relative to the second sliding sub-member 302. When the first sliding sub-member 301 and the second sliding sub-member 302 are the same in structure and shape, the mechanical property of the first sliding sub-member 301 is the same as that of the second sliding sub-member 302, and the first sliding sub-member 301 abuts against the second sliding sub-member 302, so as to enable abutting forces between the first sliding sub-member 301 and the second sliding sub-member 302 to be distributed uniformly. The first sliding sub-member 301 and the second sliding sub-member 302 are symmetrically arranged along the symmetry plane 200A of the rotating member 200, thereby avoiding a situation that a displacement of the rotating member 200 is generated and the rotating member 200 is further stuck due to uneven forces between the first sliding sub-member 301 and the second sliding sub-member 302. Moreover, at least one of the first sliding sub-member 301 or the second sliding sub-member 302 abuts against the rotating member 200, the gap between the rotating member 200 and the device body 100 can be kept, facilitating reducing the friction force between the rotating member 200 and the device body 100, and thus, on the one hand, the device body 100 can be prevented from being scratched due to the movement of the rotating member 200, and on the other hand, the rotating member 200 can be prevented from being stuck.

Figure 16:
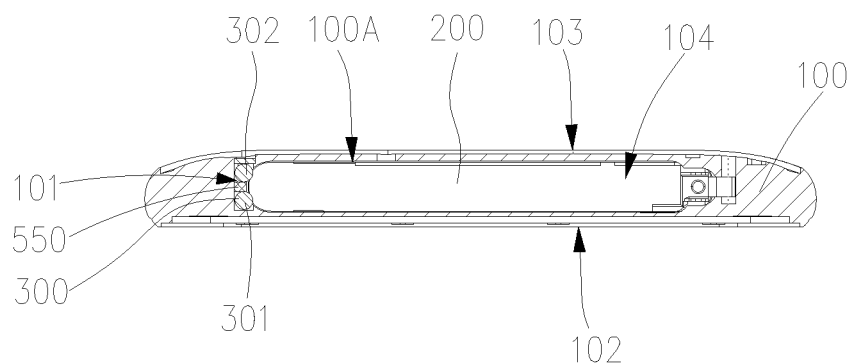
FIG. 16 is a schematic structural view of an example electronic device according to an implementation of the present disclosure.

Referring to FIG. 16, in another implementation, a spacer 550 is disposed between the first sliding sub-member 301 and the second sliding sub-member 302, and the spacer 550 separates the first sliding sub-member 301 from the second sliding sub-member 302.

The spacer 550 is spaced apart from the rotating member 200. That is, the spacer 550 is free from interfering with the movement of the rotating member 200, such that a smooth movement of the rotating member 200 relative to the device body 100 can be achieved. The spacer 550 is disposed between the first sliding sub-member 301 and the second sliding sub-member 302, a mutual interference between the first sliding sub-member 301 and the second sliding sub-member 302 due to inconsistent movement directions can be avoided. In such a case that the first sliding sub-member 301 and the second sliding sub-member 302 move asynchronously, the mutual interference between the first sliding sub-member 301 and the second sliding sub-member 302 is inevitable, resulting in uneven forces generated between the first sliding sub-member 301 and the second sliding sub-member 302. When such uneven forces are transmitted to the rotating member 200, the displacement of the rotating member 200 is generated, and thus the gap between the rotating member 200 and the device body 100 may disappear. At this point, the rotating member 200 is in a risk of being stuck, and application functions of the electronic device 10 fail to be achieved normally.

Figure 17:
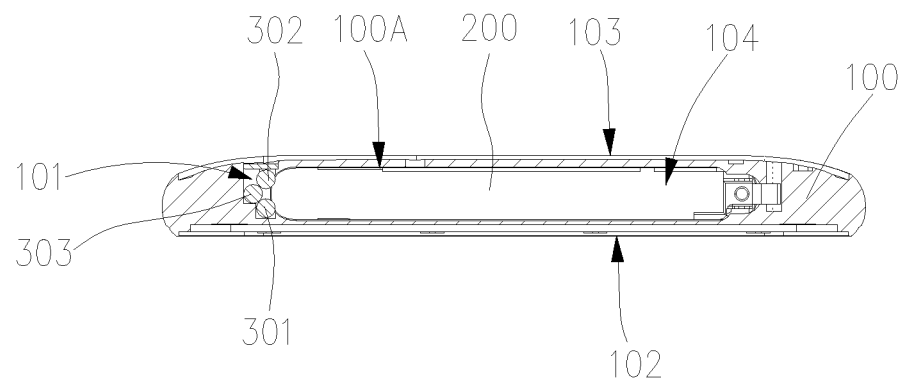
FIG. 17 is a schematic structural view of an example electronic device according to an implementation of the present disclosure.

Referring to FIG. 17, the sliding member 300 further includes a third sliding sub-member 303. The third sliding sub-member 303 is received in the mounting hole 101. The first sliding sub-member 301 and the second sliding sub-member 302 both abut against the third sliding sub-member 303.

In this implementation, the first sliding sub-member 301 directly abuts against the third sliding sub-member 303, and the second sliding sub-member 302 directly abuts against the third sliding sub-member 303. That is, the first sliding sub-member 301 is operable to slide relative to the third sliding sub-member 303, the second sliding sub-member 302 is operable to slide relative to the third sliding sub-member 303, and the first sliding sub-member 301 and the second sliding sub-member 302 both abut against the rotating member 200. The first sliding sub-member 301 directly abuts against and is operable to slide relative to the third sliding sub-member 303, the second sliding sub-member 302 directly abuts against and is operable to slide relative to the third sliding sub-member 303, thereby enabling a smooth movement of the first sliding sub-member 301 relative to the third sliding sub-member 303, and a smooth movement of the second sliding sub-member 302 relative to the third sliding sub-member 303. When the first sliding sub-member 301, the second sliding sub-member 302, and the third sliding sub-member 303 are the same in structure, since the first sliding sub-member 301, the second sliding sub-member 302, and the third sliding sub-member 303 have the same mechanical properties, the first sliding sub-member 301 abuts against the third sliding sub-member 303, and the second sliding sub-member 302 abuts against the third sliding sub-member 303, abutting forces between the first sliding sub-member 301 and the third sliding sub-member 303 and abutting forces between the second sliding sub-member 302 and the third sliding sub-member 303 are distributed uniformly. Moreover, the first sliding sub-member 301 and the second sliding sub-member 302 are symmetrically arranged along the symmetry plane 200A of the rotating member 200, thereby avoiding a situation that a displacement of the rotating member 200 is generated and the rotating member 200 is further stuck due to uneven forces between the first sliding sub-member 301 and the second sliding sub-member 302. The first sliding sub-member 301 and the second sliding sub-member 302 cooperatively abut against the rotating member 200, the forces acting on the rotating member 200 can be balanced, such that the gap between the rotating member 200 and the device body 100 can be kept, facilitating reducing the friction force between the rotating member 200 and the device body 100, and thus, on the one hand, the device body 100 can be prevented from being scratched due to the movement of the rotating member 200, and on the other hand, the rotating member 200 can be prevented from being stuck.

Figure 18:
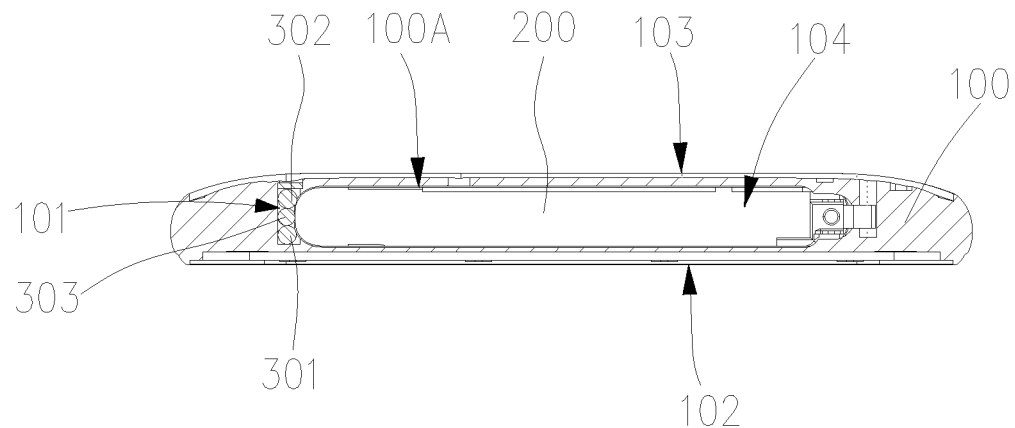
FIG. 18 is a schematic structural view of an example electronic device according to an implementation of the present disclosure.

Referring to FIG. 18, the third sliding sub-member 303 is disposed between the first sliding sub-member 301 and the second sliding sub-member 302. The first sliding sub-member 301, the second sliding sub-member 302, and the third sliding sub-member 303 are stacked in a direction in which the mounting hole 101 extends.

In this implementation, the first sliding sub-member 301 abuts against the third sliding sub-member 303, the second sliding sub-member 302 abuts against the third sliding sub-member 303, and the first sliding sub-member 301, the second sliding sub-member 302, and the third sliding sub-member 303 all abut against the rotating member 200. The first sliding sub-member 301 abuts against the third sliding sub-member 303 on the one hand, and also abuts against the rotating member 200 on the another hand. The second sliding sub-member 302 abuts against the third sliding sub-member 303 on the one hand, and also abuts against the rotating member 200 on the another hand. The third sliding sub-member 303 abuts against all the first sliding sub-member 301, the second sliding sub-member 302, and the rotating member 200. All the first sliding sub-member 301, the second sliding sub-member 302, and the third sliding sub-member 303 abut against the rotating member 200, such that the gap between the rotating member 200 and the device body 100 can be kept, and the rotating member 200 is free from contact with the device body 100, thereby preventing the device body 100 being scratched by the rotating member 200, reducing the friction force between the rotating member 200 and the device body 100, and enabling a smooth rotation of the rotating member 200 relative to the device body 100.

In an implementation, the mounting hole 101 extends along an arc trajectory. That is, the first sliding sub-member 301, the second sliding sub-member 302, and the third sliding sub-member 303 are arranged along the arc trajectory, and the first sliding sub-member 301, the second sliding sub-member 302, and the third sliding sub-member 303 all abut against the rotating member 200. Since the first sliding sub-member 301, the second sliding sub-member 302, and the third sliding sub-member 303 can apply abutting forces against the rotating member 200 in multiple directions, when the abutting forces exerted against the rotating member 200 in multiple directions are balanced, the rotating member 200 can be kept balanced, thereby facilitating keeping the gap between the rotating member 200 and the device body 100, preventing the rotating member 200 from being in direction contact with the device body 100, preventing the device body 100 from being scratched by the rotating member 200, reducing the friction force between the rotating member 200 and the device body 100 to achieve a relatively smooth rotation of the rotating member 200 relative to the device body 100 can be achieved. Since the first sliding sub-member 301, the second sliding sub-member 302, and the third sliding sub-member 303 are arranged along the arc trajectory, the first sliding sub-member 301, the second sliding sub-member 302, and the third sliding sub-member 303 can be well fitted to a surface of the rotating member 200, thereby providing the abutting forces for the rotating member 200 and achieving a smooth movement of the rotating member 200.

Figure 19:
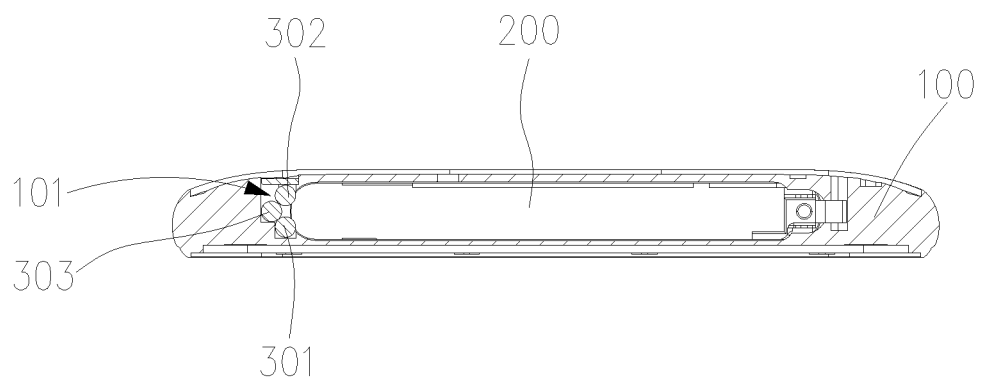
FIG. 19 is a schematic structural view of an example electronic device according to an implementation of the present disclosure.

Referring to FIG. 19, the first sliding sub-member 301 and the second sliding sub-member 302 are stacked in a direction in which the mounting hole 101 extends. The third sliding sub-member 303 is disposed at a side of the first sliding sub-member 301 away from the rotating member 200, and the third sliding sub-member 303 abuts against both the first sliding sub-member 301 and the second sliding sub-member 302.

In this implementation, the third sliding sub-member 303 is spaced apart from the rotating member 200, the third sliding sub-member 303 abuts against the rotating member 200 through the first sliding sub-member 301 and the second sliding sub-member 302. The first sliding sub-member 301 is operable to slide relative to the second sliding sub-member 302 through the third sliding sub-member 303. The third sliding sub-member 303 applies abutting forces against the first sliding sub-member 301 and the second sliding sub-member 302 respectively, and the abutting forces exerted by the third sliding sub-member 303 are transmitted to the rotating member 200 through the first sliding sub-member 301 and the second sliding sub-member 302. The directions of the abutting forces exerted against the first sliding sub-member 301 and the second sliding sub-member 302 by the third sliding sub-member 303 are changed by controlling a position of the third sliding sub-member 303 relative to the first sliding sub-member 301 and a position of the third sliding sub-member 303 relative to the second sliding sub-member 302, thereby achieving a balance of the forces applied on the rotating member 200, keeping the gap between the rotating member 200 and the device body 100, and preventing the device body 100 from being scratched due to the movement of the rotating member 200. Moreover, the situation that the rotating member 200 is stuck can be avoided, such that the smooth rotation of the rotating member 200 relative to the device body 100 can be achieved.

Figure 20:
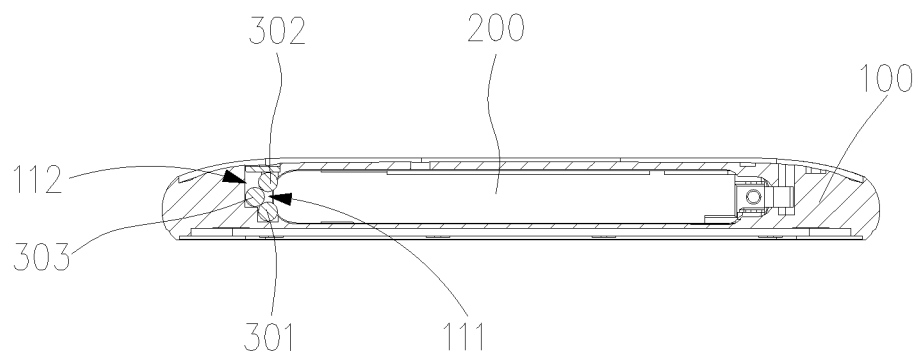
FIG. 20 is a schematic structural view of an example electronic device according to an implementation of the present disclosure.

Referring to FIG. 20, the mounting hole 101 includes a first limiting hole 111 and a second limiting hole 112 in communication with the first limiting hole 111. The second limiting hole 112 is further away from the rotating member 200 than the first limiting hole 111. The first sliding sub-member 301 and the second sliding sub-member 302 are received in the first limiting hole 111, and the third sliding sub-member 303 is received in the second limiting hole 112.

The second limiting hole 112 has a larger inner diameter than the first limiting hole 111. The first sliding sub-member 301 and the second sliding sub-member 302 are received in the first limiting hole 111. The third sliding sub-member 303 is received in the second limiting hole 112. The third sliding sub-member 303 is positioned between the first sliding sub-member 301 and the second sliding sub-member 302 and is disposed at a side away from the rotating member 200 (that is, the third sliding sub-member 303 is disposed at a side of the first sliding sub-member 301 or the second sliding sub-member 302 away from the rotating member 200). A movement of the third sliding sub-member 303 can be limited by the second limiting hole 112, the first sliding sub-member 301, and the second sliding sub-member 302.

In an implementation, the sliding member 300 is a ball, and the first sliding sub-member 301, the second sliding sub-member 302, and the third sliding sub-member 303 are the same in volume.

In this implementation, the first sliding sub-member 301, the second sliding sub-member 302, and the third sliding sub-member 303 are completely identical. When the first sliding sub-member 301 abuts against the rotating member 200, the second sliding sub-member 302 abuts against the rotating member 200, and the third sliding sub-member 303 abuts against both the first sliding sub-member 301 and the second sliding sub-member 302, the first sliding sub-member 301 and the second sliding sub-member 302 are symmetrically distributed about the symmetry plane 200A of the rotating member 200 and the third sliding sub-member 303 itself is symmetrical about the symmetry plane 200A of the rotating member 200. In this way, a first abutting force exerted against the rotating member 200 by the first sliding sub-member 301 is in balance with a second abutting force exerted against the rotating member 200 by the second sliding sub-member 302, such that the gap between the rotating member 200 and the device body 100 can be kept. Thus, on the one hand, the friction force between the rotating member 200 and the device body 100 is reduced to realize the smooth movement of the rotating member 200 relative to the device body 100, and on the other hand, the device body 100 can be prevented from being scratched due to the movement of the rotating member 200. In addition, the first sliding sub-member 301, the second sliding sub-member 302, and the third sliding sub-member 303 are able to slide relative to one another smoothly, thereby enabling the rotating member 200 to move relative to the device body 100 smoothly.

Figure 21:
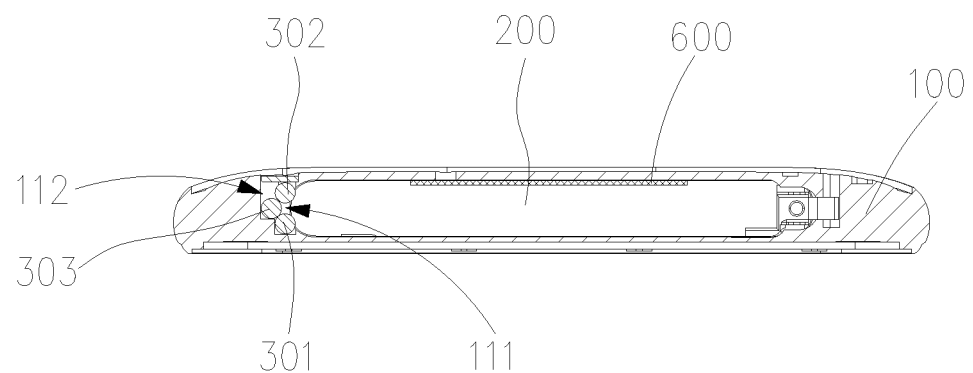
FIG. 21 is a schematic structural view of an example electronic device according to an implementation of the present disclosure.

Referring to FIG. 21, a resilient piece 600 is further disposed between the rotating member 200 and the device body 100. The resilient piece 600 limits a movement of the rotating member 200 when the rotating member 200 rotates relative to the device body 100.

In an implementation, the resilient piece 600 is fixed to the rotating member 200 and used to apply an abutting force against the device body 100, thereby preventing the rotating member 200 from approaching the device body 100, and keeping the gap between the rotating member 200 and the device body 100. On the one hand, the rotating member 200 can be prevented from being stuck, and a relatively smooth movement of the rotating member 200 relative to the device body 100 is achieved, and on the other hand, when the resilient piece 600 abuts against the device body 100, the device body 100 then applies a reaction force on the resilient piece 600, and the reaction force is transmitted to the rotating member 200. That is, the device body 100 applies an abutting force against the rotating member 200, thereby avoiding unnecessary shaking of the rotating member 200, and facilitating a relatively stable rotation of the rotating member 200 relative to the device body 100.

In another implementation, the resilient piece 600 is fixed to the device body 100 and used to apply an abutting force against the rotating member 200, thereby preventing the rotating member 200 from approaching the device body 100, and keeping the gap between the rotating member 200 and the device body 100. On the one hand, the rotating member 200 can be prevented from being stuck, and a relatively smooth movement of the rotating member 200 relative to the device body 100 is achieved, and on the other hand, when the resilient piece 600 abuts against the rotating member 200, the rotating member 200 then applies a reaction force on the resilient piece 600, and the reaction force is transmitted to the device body 100. That is, the rotating member 200 applies an abutting force against the device body 100, thereby keeping the gap between the device body 100 and the rotating member 200, and facilitating a relatively smooth rotation of the rotating member 200 relative to the device body 100.

Figure 22:
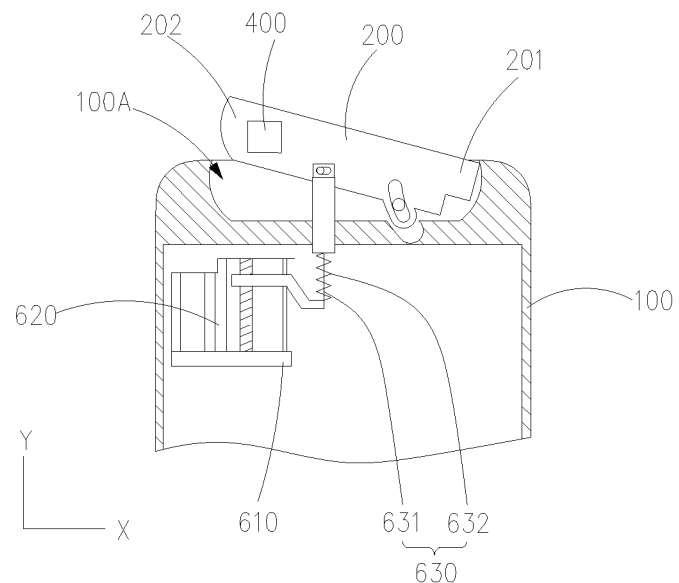
FIG. 22 is a schematic structural view of an example electronic device according to an implementation of the present disclosure.

Referring to FIG. 22, the electronic device 10 further includes a driving assembly 610. The driving assembly 610 includes a driving mechanism 620 and a pushing assembly 630. The driving mechanism 620 is fixedly coupled to the device body 100, and the pushing assembly 630 is movably coupled to the second end 202. The driving mechanism 620 is operable to control a movement of the pushing assembly 630, such that the second end 202 swings relative to the device body 100 and is enabled to be extended out of or received in the receiving groove 100A.

The pushing assembly 630 includes a pushing member 631 and an elastic member 632. The pushing member 631 has an end movably coupled to the rotating member 200 and another end slidable relative to the driving mechanism 620. The elastic member 632 is sleeved on the pushing member 631. The elastic member 632 has an end fixedly coupled to the pushing member 631 and another end fixedly coupled to the driving mechanism 620. The driving mechanism 620 is operable to move the elastic member 632 so as to drive the rotating member 200 to swing, enabling the rotating member 200 to be extended out of or received in the receiving groove 100A.

Figure 23:
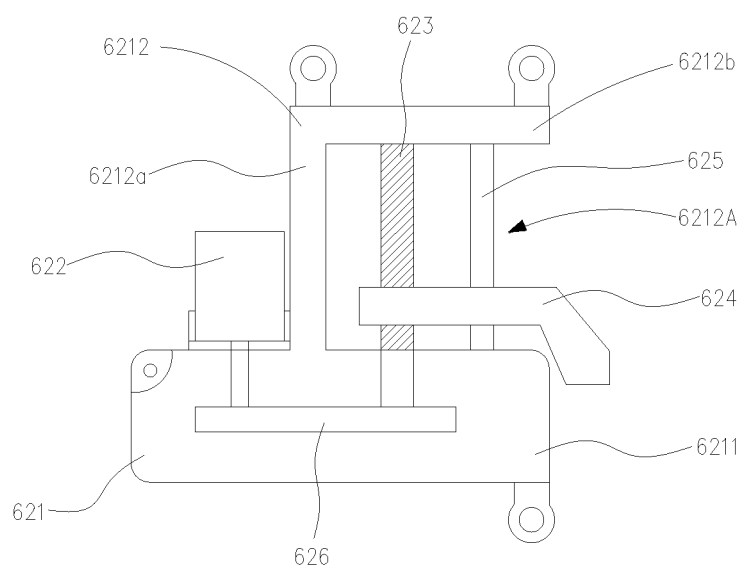
FIG. 23 is a schematic structural view of a driving mechanism in an electronic device according to an implementation of the present disclosure.

Referring to FIG. 23, the driving mechanism 620 includes a box body 621, a driving motor 622, a rotating member 623, and a sliding member 624. The box body 621 is fixedly coupled to the device body 100, the driving motor 622 is fixedly coupled to the box body 621, and the rotating member 623 is rotatably coupled to the box body 621. The driving motor 622 is operable to control a rotation of the rotating member 623. The sliding member 624 has an end sleeved on the rotating member 623 and another end coupled to the elastic member 632. When the driving motor 622 controls the rotation of the rotating member 623 to drive the sliding member 624 to move, the elastic member 632 moves toward or away from the rotating member 623.

The driving mechanism 620 further includes a guiding member 625. The guiding member 625 is fixedly coupled to the box body 621, and the sliding member 624 is sleeved on the guiding member 625. The guiding member 625 is used to assist the movement of the sliding member 624. The rotating member 623, the guiding member 625, and the driving motor 622 are arranged side by side. The guiding member 625 and the rotating member 623 together act as a sliding trajectory of the sliding member 624.

The driving mechanism 620 further includes a transmission member 626. The box body 621 includes a main body 6211 and an extending portion 6212 extending from a side of the main body 6211. The main body 6211 is used to fix the driving motor 622. The transmission member 626 is received in the main body 6211. The extending portion 6212 defines a receiving space 6212A. The rotating member 623 and the sliding member 624 are received in the receiving space 6212A. The rotating member 623 is rotatably coupled to the extending portion 6212. When a driving force output from the driving motor 622 is transmitted to the rotating member 623 through the transmission member 626, the rotating member 623 is driven to rotate relative to the extending portion 6212 about a central axis of the rotating member 623, so as to drive the sliding member 624 to slide relative to the extending portion 6212.

The extending portion 6212 includes a fixing portion 6212a and a connecting portion 6212b coupled with the fixing portion 6212a. The fixing portion 6212a is fixedly coupled to the main body 6211. The connecting portion 6212b is coupled to the fixing portion 6212a and disposed at a side of the fixing portion 6212a away from the main body 6211. The fixing portion 6212a and the rotating member 623 are arranged side by side, and the sliding member 624 is disposed between the connecting portion 6212b and the main body 6211.

The driving motor 622 is disposed at a side of the fixing portion 6212a away from the connecting portion 6212b. The driving motor 622 and the rotating member 623 are arranged side by side. The driving motor 622, the rotating member 623, and the sliding member 624 are arranged at the same side of the box body 6211.

Referring to FIG. 24, the device body 100 defines a receiving space 100D. The receiving space 100D communicates with the receiving groove 100A via a first through hole 100d. The driving mechanism 620 is fully accommodated in the receiving space 100D. A part of the pushing assembly 630 is accommodated in the receiving space 100D. The pushing member 631 may extend out of or be received in the receiving space 100D via the first through hole 100d. A sealing sleeve 640 is sleeved on the elastic member 632 and the pushing member 631. A sealing ring 650 is sleeved on the sealing sleeve 640. The sealing ring 650 is fixed to the device body 100 and received in the first through hole 100d. The sealing sleeve 640 and the sealing ring 650 work together to seal the pushing assembly 630.

Referring to FIG. 25, the electronic device 10 includes the rotating member 200 and the device body 100. The rotating member 200 has an end rotatably coupled to the device body 100. The device body 100 is provided with the sliding member 300, and the sliding member 300 is rotatable relative to the rotating member 200. The sliding member 300 is used to provide an abutting force F for the rotating member 200 such that another end of the rotating member 200 rotates relative to the device body 100 along a predetermined trajectory.

In an implementation, the predetermined trajectory is in a shape of a segment of a circle, and a curvature center of the predetermined trajectory is positioned at a side of the sliding member 300 close to the rotating member 200.

In an implementation, the sliding member 300 includes one sliding member 300 or multiple sliding members 300. The sliding member 300 may be a ball, a roller, or other sliding structures. In this implementation, the rotating member 200 is in point contact with the sliding member 300, such that a friction force acting on the rotating member 200 can be minimized. The sliding member 300 is disposed in the device body 100 and slidable relative to the rotating member 200. The sliding member 300 is used to abut against the rotating member 200 and provide an abutting force against the rotating member 200. The sliding member 300 is operable to assist the rotating member 200 in rotating relative to the device body 100 along the predetermined trajectory under the premise that the gap between the rotating member 200 and the device body 100 is kept. In such a case that the sliding member 300 is a ball, the ball is in point contact with the rotating member 200. Compared with the surface contact between the rotating member 200 and the device body 100, the point contact between the rotating member 200 and the device body 100 results in a less friction force due to that a contact area is smaller, thereby achieving a smooth movement of the rotating member relative to the device body and preventing the rotating member 200 from being stuck.

Further, since the rotating member 200 is not in direct contact with the device body 100, the device body 100 can be prevented from being scratched due to the movement of the rotating member 200, thereby avoiding damage of an anode layer of the device body 100.

The electronic device 10 according to the implementations of the present disclosure includes the device body 100 and the rotating member 200 rotatably coupled with the device body 100. The device body 100 is provided with the sliding member 300, and the sliding member 300 is slidable relative to the rotating member 200. When the rotating member 200 rotates relative to the device body 100, the sliding member 300 applies an abutting force against the rotating member 200, enabling another end of the rotating member 200 to rotate relative to the device body 100 along the predetermined trajectory. The sliding member 300 abutting against the rotating member 200 can make a gap be defined between the rotating member 200 and the device body 100, such that the rotating member 200 is free of direct contact with the device body 100, thereby preventing the device body 100 from being scratched due to the movement of the rotating member 200, reducing the friction force when the rotating member 200 moves relative to the device body 100, avoiding that the rotating member 200 is stuck, and achieving a smooth movement of the rotating member 200 relative to the device body 100. Moreover, the sliding member 300 slides along and abuts against the rotating member 200, an unnecessary shaking of the rotating member 200 can be avoided under the premise of achieving a normal sliding movement of the rotating member 200, such that a structural arrangement of the electronic device 10 is refined.

Referring to FIG. 26, the device body 100 defines a mounting hole 101. The sliding member 300 is received in the mounting hole 101, and a sidewall of the mounting hole 101 is used to apply a circumferential abutting force against the sliding member 300.

In an implementation, the mounting hole 101 includes the first mounting hole 101a and the second mounting hole 101b. The first sliding member 310 is disposed in the first mounting hole 101a, and the second sliding member 320 is disposed in the second mounting hole 101b. The rotating member 200 is rotatably coupled to the device body 100. The first sliding member 310 is used to apply the first abutting force against the rotating member 200, the second sliding member 320 is used to apply the second abutting force against the rotating member 200, and the first abutting force and the second abutting force cooperate to limit the movement of the rotating member 200.

In this implementation, the sliding member 300 includes the first sliding member 310 and the second sliding member 320. The first sliding member 310 and the second sliding member 320 both abut against the rotating member 200, keeping the gap between the rotating member 200 and the device body 100, and preventing the device body 100 from being scratched due to the movement of the rotating member 200. The first sliding member 310 and the second sliding member 320 are symmetrically arranged along the symmetry plane 200A of the rotating member 200. The sliding member 300 abutting against the rotating member 200 can make the rotating member 200 be free of direct contact with the device body 100, such that the contact area during friction is reduced, reducing a friction force acting on the rotating member 200, and achieving a smooth movement of the rotating member 200 relative to the device body 100. In such a case that the first sliding member 310 and the second sliding member 320 are both balls, the first sliding member 310 is in point contact with the second sliding member 320 and the rotating member 200, and the friction force during the rotation of the rotating member 200 can be minimized, thereby avoiding a situation that the rotating member 200 is stuck.

Referring to FIG. 27, the electronic device further includes a limiting member 500 disposed at the opening of the mounting hole 101. The limiting member 500 is used for applying an abutting force against the sliding member 300 in a direction in which the mounting hole 101 extends.

In an implementation, the limiting member 500 includes the first limiting member 510 and the second limiting member 520. The first limiting member 510 is positioned at the opening of the first mounting hole 101a for providing the first sliding member 310 with a first supporting force along a direction in which the first mounting hole 101a extends. The second limiting member 520 is positioned at the opening of the second mounting hole 101b for providing the second sliding member 320 with a second supporting force along a direction in which the second mounting hole 101b extends.

In an implementation, the spacer 550 is disposed between the first mounting hole 101a and the second mounting hole 101b. The spacer 550 provides a third supporting force for the first sliding member 310, and provides a fourth supporting force for the second sliding member 320. The third supporting force is equal in magnitude and opposite in direction to the first supporting force, and the fourth supporting force is equal in magnitude and opposite in direction to the second supporting force.

In this implementation, the spacer 550 is spaced apart from the rotating member 200. That is, the spacer 550 is free from interfering with the movement of the rotating member 200, such that a smooth movement of the rotating member 200 relative to the device body 100 can be achieved. The spacer 550 is disposed between the first mounting hole 101a and the second mounting hole 101b. The first sliding member 310 is disposed in the first mounting hole 101a and the second sliding member 320 is disposed in the second mounting hole 101b, such that a mutual interference between the first sliding member 310 and the second sliding member 320 generated due to inconsistent movement directions can be avoided. In such a case that the first sliding member 310 and the second sliding member 320 move asynchronously, the mutual interference between the first sliding member 310 and the second sliding member 320 is inevitable, resulting in uneven forces generated between the first sliding member 310 and the second sliding member 320. When such uneven forces are transmitted to the rotating member 200, the displacement of the rotating member 200 is generated, and thus the gap between the rotating member 200 and the device body 100 may disappear. At this point, the rotating member 200 is in a risk of being stuck, and application functions of the electronic device 10 fail to be achieved normally.

In an implementation, the spacer 550 may be additionally provided, neither a part of the rotating member 200 itself nor a part of the device body 100 itself. The spacer 550 is fixedly mounted on the device body 100 or the rotating member 200 to form a separation between the first sliding member 310 and the second sliding member 320.

In another implementation, the spacer 550 is a part of the device body 100. When processing the device body 100, the spacer 550 is formed integrally with the device body 100, such that it is unnecessary to provide a structure for fixing the spacer 550, thereby facilitating making the electronic device 10 be light and thin.

In another implementation, the spacer 550 is a part of the rotating member 200. When processing the rotating member 200, the spacer 550 is formed integrally with the rotating member 200, such that it is unnecessary to provide a structure for fixing the spacer 550, thereby facilitating making the electronic device 10 be light and thin.

In another implementation, a sidewall of the first mounting hole 101*a* provides the first sliding member 310 with a first elastic force toward the rotating member 200, and a sidewall of the second mounting hole 101*b* provides the second sliding member 320 with a second elastic force toward the rotating member 200. The first elastic force acts as the first abutting force, and the second elastic force acts as the second abutting force.

In an implementation, the rotating member 200 has a curved-shaped portion adjacent to the first mounting hole 101*a* and the second mounting hole 101*b*. The portion includes a first curved portion 2001 and a second curved portion 2002 coupled with the first curved portion 2001. A supporting force exerted against the first curved portion 2001 by the first sliding member 310 acts as the first elastic force, and the first elastic force is directed to a curvature center of the first curved portion 2001. A supporting force exerted against the second curved portion 2002 by the second sliding member 320 acts as the second elastic force, and the second elastic force is directed to a curvature center of the second curved portion 2002.

In this implementation, when the portion of the rotating member 200 abutting against the first sliding member 310 and the second sliding member 320 is in a curved shape, the stress distribution at the portion is divergent, thereby enabling forces acting on the portion of the rotating member 200 to be uniform, and avoiding stress concentration. When the first sliding member 310 is in close contact with the first curved portion 2001 and slides relative to the first curved portion 2001, and the second sliding member 320 is in close contact with the second curved portion 2002 and slides relative to the second curved portion 2002, a smooth movement of the first sliding member 310 and the second sliding member 320 is achieved. Therefore, on the one hand, a relatively stable rotation of the rotating member 200 relative to the device body 100 can be achieved, and on the other hand, since the movement of the first sliding member 310 and the second sliding member 320 relative to the rotating member 200 is relatively smooth, and abutting forces exerted against the rotating member 200 by the first sliding member 310 and the second sliding member 320 are also distributed relatively evenly, an unnecessary offset of the rotating member 200 can be avoided, facilitating a relatively smooth movement of the rotating member 200 relative to the device body 100.

In an implementation, the curvature center of the first curved portion 2001 is positioned at a side of the rotating member 200 away from the first mounting hole 101*a*, and the curvature center of the second curved portion 2002 is positioned at a side of the rotating member 200 away from the second mounting hole 101*b*. A curvature radius of the first curved portion 2001 is consistent with a curvature radius of the second curved portion 2002.

In this implementation, the first curved portion 2001 is in a convex shape, and the second curved portion 2002 is in a convex shape. When the curvature radius of the first curved portion 2001 equals the curvature radius of the second curved portion 2002 and the first sliding member 310 has the same volume as the second sliding member 320, an abutting force exerted against the first curved portion 2001 by the first sliding member 310 is in consistence with an abutting force exerted against the second curved portion 2002 by the second sliding member 320. At this point, the abutting forces exerted against the rotating member 200 by the first sliding member 310 and the second sliding member 320 are distributed evenly, such that the rotating member 200 can be kept in a centered position relative to the device body 100, the gap between the rotating member 200 and the device body 100 can be easily achieved, and a smooth rotation of the rotating member 200 relative to the device body 100 can be achieved.

Figure 28:
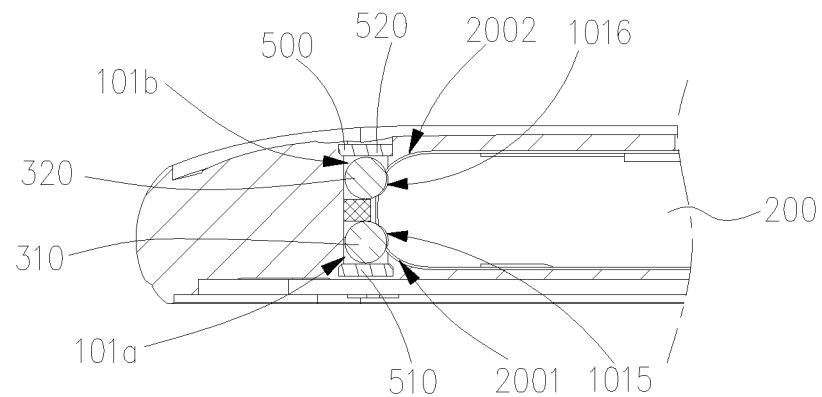
FIG. 28 is a schematic structural view of an example electronic device according to an implementation of the present disclosure.

Referring to FIG. 28, in still another implementation, the rotating member 200 defines a first groove 1015 and a second groove 1016 spaced apart from the first groove 1015. When the rotating member 200 rotates relative to the device body 100, the first sliding member 310 can be fitted with and slide on an inner wall of the first groove 1015, and the second sliding member 320 can be fitted with and slide on an inner wall of the second groove 1016.

In this implementation, the first groove 1015 is used for limiting the movement of the first sliding member 310, and the second groove 1016 is used for limiting the movement of the second sliding member 320. The first groove 1015 and the second groove 1016 are arranged in parallel and spaced apart from each other, such that the abutting forces exerted against the rotating member 200 by the first sliding member 310 and the second sliding member 320 each are kept in a constant direction. That is, during the rotation of the rotating member 200 relative to the device body 100, the abutting forces exerted against the rotating member 200 by the first sliding member 310 and the second sliding member 320 are always attributed evenly, thereby avoiding uneven distribution of forces applied on the rotating member 200 during the rotation of the rotating member 200 relative to the device body 100, keeping the gap between the rotating member 200 and the device body 100, avoiding that the rotating member 200 is stuck, and enabling a smooth rotation of the rotating member 200 relative to the device body 100.

In an implementation, the first sliding member 310 is slidably along the first groove 1015, and the second sliding member 320 is slidably along the second groove 1016. At this point, the first sliding member 310 is in surface contact with the first groove 1015, and the second sliding member 320 is also in surface contact with the second groove 1016. In this implementation, the first sliding member 310 and the second sliding member 320 are enabled to be in surface contact with the rotating member 200, to increase a contact area between the first sliding member 310 and the first groove 1015 and a contact area between the second sliding member 320 and the second groove 1016, such that stably limiting the movement of the first sliding member 310 can be achieved via the first groove 1015 and stably limiting the movement of the second sliding member 320 can be achieved via the second groove 1016, the rotating member 200 can be prevented from shaking during the rotation of the rotating member 200 relative to the device body 100, and a relatively stable rotation of the rotating member 200 relative to the device body 100 can be achieved.

In another implementation, the sliding member 300 is a ball. The first sliding member 310 and the second sliding member 320 are the same in volume, and the first abutting force and the second abutting force are equal in magnitude.

In this implementation, the first sliding member 310 is completely identical to the second sliding member 320. The first mounting hole 101*a* is opposite to the second mounting hole 101*b*, and the first mounting hole 101*a* and the second mounting hole 101*b* are also completely identical in radial dimension. When the first sliding member 310 abuts against the rotating member 200 and the second sliding member 320 abuts against the rotating member 200, the first sliding member 310 and the second sliding member 320 are symmetrically arranged along the symmetry plane 200A of the rotating member 200, and a balance between a first abutting force exerted against the rotating member 200 by the first sliding member 310 and a second abutting force exerted against the rotating member 200 by the second sliding member 320 can be achieved, thereby keeping the gap between the rotating member 200 and the device body 100, and thus, on the one hand, the friction force between the rotating member 200 and the device body 100 is reduced, such that a smooth movement of the rotating member 200 relative to the device body 100 is achieved, and on the other hand, the device body 100 can be prevented from being scratched due to the movement of the rotating member 200.

Figure 29:
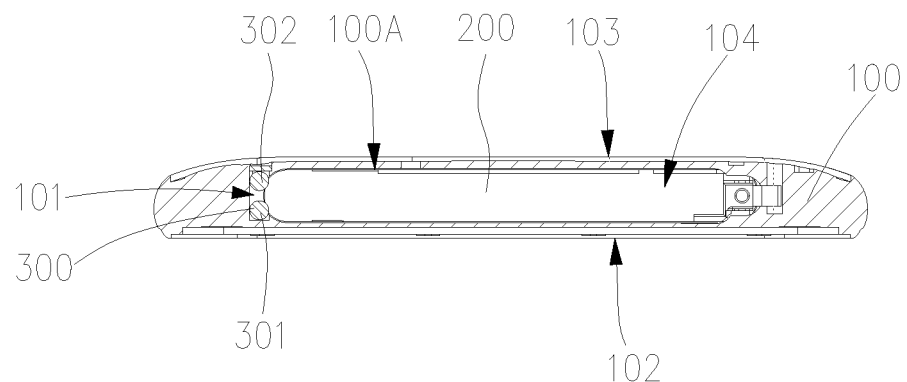
FIG. 29 is a schematic structural view of an example electronic device according to an implementation of the present disclosure.

Referring to FIG. 29, the sliding member 300 includes a first sliding sub-member 301 and a second sliding sub-member 302. The first sliding sub-member 301 and the second sliding sub-member 302 are stacked in a direction in which the mounting hole 101 extends, and the second sliding sub-member 302 and the first sliding sub-member 301 cooperatively apply an abutting force against the rotating member 200.

In an implementation, the mounting hole 101 is defined on the front surface 102 or the rear surface 103 of the device body 100. The receiving groove 100A is defined on the side surface 104 of the device body 100, and the first sliding sub-member 301 and the second sliding sub-member 302 are stacked in a direction in which the mounting hole 101 extends. When the rotating member 200 is received in the receiving groove 100A of the device body 100, an opening of the mounting hole 101 abuts against an inner wall of the device body 100 (for example, the opening of the mounting hole 101 is covered and sealed by the inner wall of the device body 100), such that water and dust can be prevented from entering the mounting hole 101.

Figure 30:
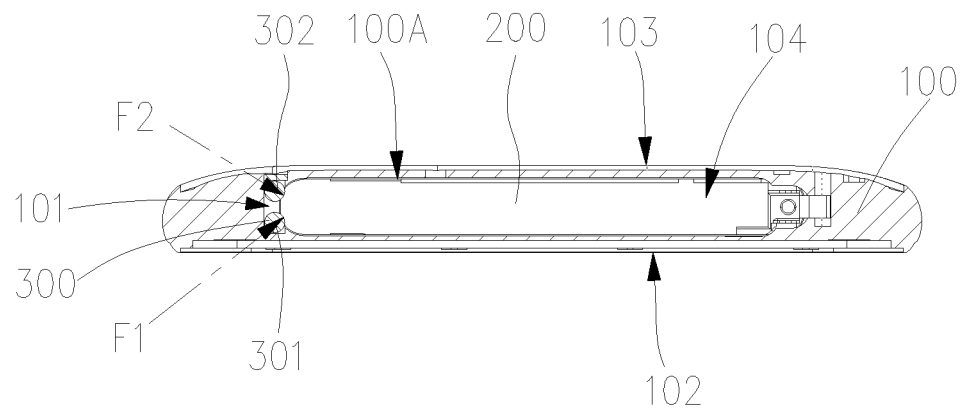
FIG. 30 is a schematic structural view of an example electronic device according to an implementation of the present disclosure.

Referring to FIG. 30, the first sliding sub-member 301 applies a first abutting force F1 in a first direction against the rotating member 200, and the second sliding sub-member 302 applies a second abutting force F2 in a second direction against the rotating member 200. The first abutting force F1 includes a component force in the direction in which the mounting hole 101 extends and the second abutting force F2 includes a component force in the direction in which the mounting hole 101 extends. The component force of the first abutting force F1 is equal in magnitude and opposite in direction to the component force of the second abutting force F2.

In this implementation, the first sliding sub-member 301 is in direct contact with the second sliding sub-member 302. That is, the first sliding sub-member 301 is operable to slide relative to the second sliding sub-member 302, and at least one of the first sliding sub-member 301 or the second sliding sub-member 302 abuts against the rotating member 200. The first sliding sub-member 301 directly abuts against and is operable to slide relative to the second sliding sub-member 302, thereby enabling a smooth movement of the first sliding sub-member 301 relative to the second sliding sub-member 302. When the first sliding sub-member 301 and the second sliding sub-member 302 are the same in structure and shape, the mechanical property of the first sliding sub-member 301 is the same as that of the second sliding sub-member 302, and the first sliding sub-member 301 abuts against the second sliding sub-member 302, so as to enable abutting forces between the first sliding sub-member 301 and the second sliding sub-member 302 to be distributed uniformly. The first sliding sub-member 301 and the second sliding sub-member 302 are symmetrically arranged along the symmetry plane 200A of the rotating member 200, thereby avoiding a situation that a displacement of the rotating member 200 is generated and the rotating member 200 is further stuck due to uneven forces between the first sliding sub-member 301 and the second sliding sub-member 302. Moreover, at least one of the first sliding sub-member 301 or the second sliding sub-member 302 abuts against the rotating member 200, the gap between the rotating member 200 and the device body 100 can be kept, facilitating reducing the friction force between the rotating member 200 and the device body 100, and thus, on the one hand, the device body 100 can be prevented from being scratched due to the movement of the rotating member 200, and on the other hand, the rotating member 200 can be prevented from being stuck.

Figure 31:
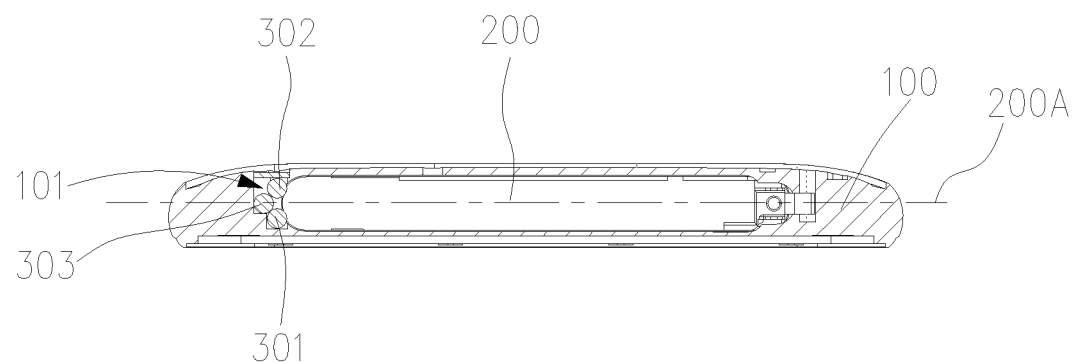
FIG. 31 is a schematic structural view of an example electronic device according to an implementation of the present disclosure.

Referring to FIG. 31, the sliding member 300 further includes a third sliding sub-member 303, and the third sliding sub-member 303 is disposed between the first sliding sub-member 301 and the second sliding sub-member 302. The first sliding sub-member 301, the second sliding sub-member 302, and the third sliding sub-member 303 cooperatively apply an abutting force against the rotating member 200.

In this implementation, the first sliding sub-member 301 directly abuts against the third sliding sub-member 303, and the second sliding sub-member 302 directly abuts against the third sliding sub-member 303. That is, the first sliding sub-member 301 is operable to slide relative to the third sliding sub-member 303, the second sliding sub-member 302 is operable to slide relative to the third sliding sub-member 303, and the first sliding sub-member 301 and the second sliding sub-member 302 both abut against the rotating member 200. The first sliding sub-member 301 directly abuts against and is operable to slide relative to the third sliding sub-member 303, the second sliding sub-member 302 directly abuts against and is operable to slide relative to the third sliding sub-member 303, thereby enabling a smooth movement of the first sliding sub-member 301 relative to the third sliding sub-member 303, and a smooth movement of the second sliding sub-member 302 relative to the third sliding sub-member 303. When the first sliding sub-member 301, the second sliding sub-member 302, and the third sliding sub-member 303 are the same in structure, since the first sliding sub-member 301, the second sliding sub-member 302, and the third sliding sub-member 303 have the same mechanical properties, the first sliding sub-member 301 abuts against the third sliding sub-member 303, and the second sliding sub-member 302 abuts against the third sliding sub-member 303, abutting forces between the first sliding sub-member 301 and the third sliding sub-member 303 and abutting forces between the second sliding sub-member 302 and the third sliding sub-member 303 are distributed uniformly. Moreover, the first sliding sub-member 301 and the second sliding sub-member 302 are symmetrically arranged along the symmetry plane 200A of the rotating member 200, thereby avoiding a situation that a displacement of the rotating member 200 is generated and the rotating member 200 is further stuck due to uneven forces between the first sliding sub-member 301 and the second sliding sub-member 302. The first sliding sub-member 301 and the second sliding sub-member 302 cooperatively abut against the rotating member 200, the forces acting on the rotating member 200 can be balanced, such that the gap between the rotating member 200 and the device body 100 can be kept, facilitating reducing the friction force between the rotating member 200 and the device body 100, and thus, on the one hand, the device body 100 can be prevented from being scratched due to the movement of the rotating member 200, and on the other hand, the rotating member 200 can be prevented from being stuck.

Figure 32:
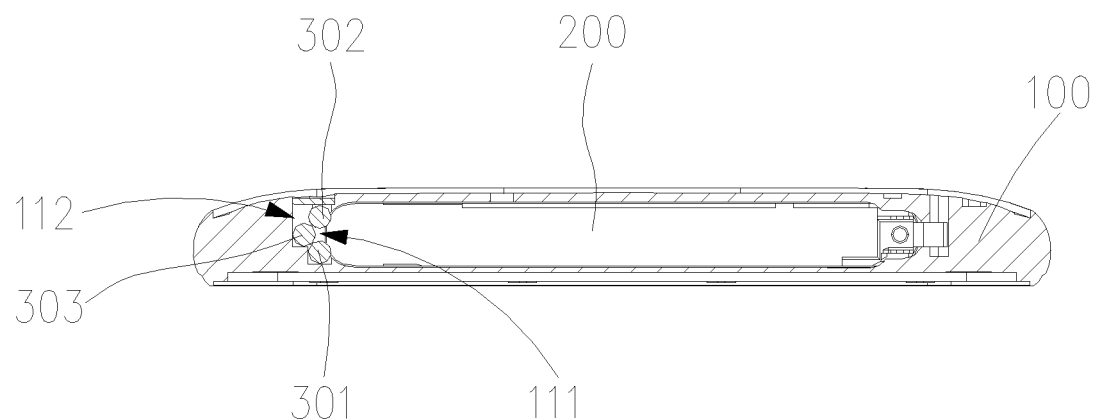
FIG. 32 is a schematic structural view of an example electronic device according to an implementation of the present disclosure.

Referring to FIG. 32, the mounting hole 101 includes a first limiting hole 111 and a second limiting hole 112 in communication with the first limiting hole 111. The second limiting hole 112 is further away from the rotating member 200 than the first limiting hole 111. The first limiting hole 111 is used for applying a circumferential abutting force against the first sliding sub-member 301 and the second sliding sub-member 302, and the second limiting hole 112 is used for applying a circumferential abutting force against the third sliding sub-member 303.

The second limiting hole 112 has a larger inner diameter than the first limiting hole 111. The first sliding sub-member 301 and the second sliding sub-member 302 are received in the first limiting hole 111. The third sliding sub-member 303 is received in the second limiting hole 112. The third sliding sub-member 303 is positioned between the first sliding sub-member 301 and the second sliding sub-member 302 and is disposed at a side away from the rotating member 200. A movement of the third sliding sub-member 303 can be limited by the second limiting hole 112, the first sliding sub-member 301, and the second sliding sub-member 302.

In this implementation, the third sliding sub-member 303 is spaced apart from the rotating member 200, the third sliding sub-member 303 abuts against the rotating member 200 through the first sliding sub-member 301 and the second sliding sub-member 302, and the first sliding sub-member 301 is operable to slide relative to the second sliding sub-member 302 through the third sliding sub-member 303. The third sliding sub-member 303 applies abutting forces on the first sliding sub-member 301 and the second sliding sub-member 302 respectively, and the abutting forces applied by the third sliding sub-member 303 are transmitted to the rotating member 200 through the first sliding sub-member 301 and the second sliding sub-member 302. The directions of the abutting forces exerted against the first sliding sub-member 301 and the second sliding sub-member 302 by the third sliding sub-member 303 are changed by controlling a position of the third sliding sub-member 303 relative to the first sliding sub-member 301 and a position of the third sliding sub-member 303 relative to the second sliding sub-member 302, thereby achieving a balance of the forces applied on the rotating member 200, keeping the gap between the rotating member 200 and the device body 100, and preventing the device body 100 from being scratched due to the movement of the rotating member 200. Moreover, the situation that the rotating member 200 is stuck can be avoided, such that the smooth rotation of the rotating member 200 relative to the device body 100 can be achieved.

Figure 33:
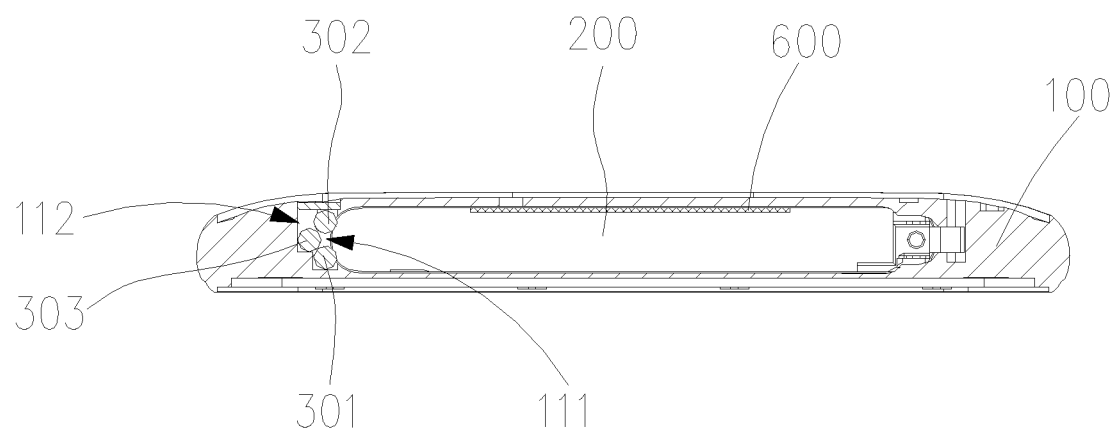
FIG. 33 is a schematic structural view of an example electronic device according to an implementation of the present disclosure.

Referring to FIG. 33, a resilient piece 600 is disposed between the rotating member 200 and the device body 100, and the resilient piece 600 is used for applying an abutting force against the rotating member 200 when the rotating member 200 rotates relative to the device body 100.

In an implementation, the resilient piece 600 is fixed to the rotating member 200 and used to apply an abutting force against the device body 100, thereby preventing the rotating member 200 from approaching the device body 100, and keeping the gap between the rotating member 200 and the device body 100. On the one hand, the rotating member 200 can be prevented from being stuck, and a relatively smooth movement of the rotating member 200 relative to the device body 100 is achieved, and on the other hand, when the resilient piece 600 abuts against the device body 100, the device body 100 then applies a reaction force on the resilient piece 600, and the reaction force is transmitted to the rotating member 200. That is, the device body 100 applies an abutting force against the rotating member 200, thereby avoiding unnecessary shaking of the rotating member 200, and facilitating a relatively stable rotation of the rotating member 200 relative to the device body 100.

The implementations of the present disclosure are described in detail above, specific examples are used herein to describe the principle and implementation manners of the present disclosure. The description of the above implementations is merely used to help understand the method and the core idea of the present disclosure. Meanwhile, those skilled in the art may make modifications to the specific implementation manners and the application scope according to the idea of the present disclosure. In summary, the contents of the specification should not be construed as limiting the present disclosure.

What is claimed is:

1. An electronic device, comprising:
    a device body; and
    a rotating member rotatably coupled with the device body;
    wherein the device body is provided with a sliding member, the sliding member being slidable relative to the rotating member and abutting against the rotating member, enabling the rotating member to be rotatable relative to the device body along a predetermined trajectory;
    wherein the electronic device defines a mounting hole, wherein the sliding member is received in the mounting hole;
    wherein the mounting hole comprises a first limiting hole and a second limiting hole in communication with the first limiting hole, wherein the second limiting hole is further away from the rotating member than the first limiting hole; and
    wherein the sliding member comprises a first sliding sub-member, a second sliding sub-member, and a third sliding sub-member, wherein the first sliding sub-member and the second sliding sub-member are received in the first limiting hole, and the third sliding sub-member is received in the second limiting hole, and wherein when the first sliding sub-member abuts against the rotating member, the second sliding sub-member abuts against the rotating member, and the third sliding sub-member abuts against both the first sliding sub-member and the second sliding sub-member.

2. The electronic device of claim 1, wherein the electronic device further comprises a limiting member disposed at an opening of the mounting hole, wherein the limiting member is used for limiting a movement of the sliding member.

3. The electronic device of claim 1, wherein the first sliding sub-member is spaced apart from the third sliding sub-member in a direction in which the mounting hole extends.

4. The electronic device of claim 1, wherein the third sliding sub-member is disposed between the first sliding sub-member and the second sliding sub-member, and the first sliding sub-member, the second sliding sub-member, and the third sliding sub-member are stacked in a direction in which the mounting hole extends.

5. The electronic device of claim 1, wherein the first sliding sub-member and the second sliding sub-member are stacked in a direction in which the mounting hole extends; and wherein the third sliding sub-member is disposed at a side of the first sliding sub-member away from the rotating member.

6. The electronic device of claim 1, further comprising a resilient piece disposed between the rotating member and the device body, wherein the resilient piece limits a movement of the rotating member when the rotating member rotates relative to the device body.

7. The electronic device of claim 1, wherein the rotating member is in point contact with the sliding member.

8. The electronic device of claim 1, wherein the rotating member is switched between a first state and a second state, wherein in the first state the rotating member is fully received in the device body, and wherein in the second state the rotating member partially extends out of the device body.

9. The electronic device of claim 8, further comprising a functional component arranged on the rotating member, wherein when the rotating member is in the second state, the functional component is exposed outside the device body.

10. An electronic device, comprising:
a rotating member; and
a device body;
an end of the rotating member being rotatably coupled with the device body;
wherein the device body being provided with a sliding member, wherein the sliding member is rotatable relative to the rotating member and used for applying an abutting force against the rotating member, enabling another end of the rotating member to be rotatable relative to the device body along a predetermined trajectory;
wherein the electronic device defines a mounting hole, wherein the sliding member is received in the mounting hole;
wherein the mounting hole comprises a first limiting hole and a second limiting hole in communication with the first limiting hole, wherein the second limiting hole is further away from the rotating member than the first limiting hole; and
wherein the sliding member comprises a first sliding sub-member, a second sliding sub-member, and a third sliding sub-member, wherein the first sliding sub-member and the second sliding sub-member are received in the first limiting hole, and the third sliding sub-member is received in the second limiting hole, and wherein when the first sliding sub-member abuts against the rotating member, the second sliding sub-member abuts against the rotating member, and the third sliding sub-member abuts against both the first sliding sub-member and the second sliding sub-member.

11. The electronic device of claim 10, wherein a sidewall of the mounting hole is used for applying a circumferential abutting force against the sliding member.

12. The electronic device of claim 11, further comprising a limiting member disposed at an opening of the mounting hole, wherein the limiting member is used for applying an abutting force against the sliding member in a direction in which the mounting hole extends.

13. An electronic device, comprising:
a device body comprising a frame assembly and a display screen installed in the frame assembly;
a sliding member coupled to the device body; and
a rotating member comprising a camera module, wherein an end of the rotating member is rotatably coupled with the device body;
wherein the sliding member is rotatable relative to the rotating member and applies an abutting force against the rotating member, enabling another end of the rotating member to rotate relative to the device body along a predetermined trajectory, and rotation of the rotating member along the predetermined trajectory enables the camera module to be switched between a position in which the camera module is outside of the device body and a position in which the camera module is received in the device body;
wherein the electronic device defines a mounting hole, wherein the sliding member is received in the mounting hole;
wherein the mounting hole comprises a first limiting hole and a second limiting hole in communication with the first limiting hole, wherein the second limiting hole is further away from the rotating member than the first limiting hole; and
wherein the sliding member comprises a first sliding sub-member, a second sliding sub-member, and a third sliding sub-member, wherein the first sliding sub-member and the second sliding sub-member are received in the first limiting hole, and the third sliding sub-member is received in the second limiting hole, and wherein when the first sliding sub-member abuts against the rotating member, the second sliding sub-member abuts against the rotating member, and the third sliding sub-member abuts against both the first sliding sub-member and the second sliding sub-member.

14. The electronic device of claim 13, wherein the electronic device further comprises a limiting member disposed at an opening of the mounting hole, wherein the limiting member is used for limiting a movement of the sliding member.

15. The electronic device of claim 13, wherein the first sliding sub-member is spaced apart from the third sliding sub-member in a direction in which the mounting hole extends.

16. The electronic device of claim 13, wherein the third sliding sub-member is disposed between the first sliding sub-member and the second sliding sub-member, and the first sliding sub-member, the second sliding sub-member, and the third sliding sub-member are stacked in a direction in which the mounting hole extends.

17. The electronic device of claim 13, wherein the first sliding sub-member and the second sliding sub-member are stacked in a direction in which the mounting hole extends; and
wherein the third sliding sub-member is disposed at a side of the first sliding sub-member away from the rotating member.

18. The electronic device of claim 13, further comprising a resilient piece disposed between the rotating member and the device body, wherein the resilient piece limits a movement of the rotating member when the rotating member rotates relative to the device body.

19. The electronic device of claim 13, wherein the rotating member is in point contact with the sliding member.

20. The electronic device of claim 13, wherein the rotating member is switched between a first state and a second state, wherein in the first state the rotating member is fully received in the device body, and wherein in the second state the rotating member partially extends out of the device body.

* * * * *